US012087885B2

(12) United States Patent
Lin et al.

(10) Patent No.: US 12,087,885 B2
(45) **Date of Patent: *Sep. 10, 2024**

(54) LIGHT-EMITTING DIODE AND METHOD FOR MANUFACTURING THE SAME

(71) Applicant: Xiamen Sanan Optoelectronics Technology Co., LTD., Xiamen (CN)

(72) Inventors: Su-hui Lin, Xiamen (CN); Feng Wang, Xiamen (CN); Ling-yuan Hong, Xiamen (CN); Sheng-Hsien Hsu, Xiamen (CN); Sihe Chen, Xiamen (CN); Dazhong Chen, Xiamen (CN); Kang-Wei Peng, Xiamen (CN); Chia-Hung Chang, Xiamen (CN)

(73) Assignee: Quanzhou San'an Semiconductor Technology Co., Ltd., Fujian (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/987,001

(22) Filed: Nov. 15, 2022

(65) Prior Publication Data

US 2023/0076695 A1 Mar. 9, 2023

Related U.S. Application Data

(63) Continuation of application No. 16/931,056, filed on Jul. 16, 2020, now Pat. No. 11,532,769, which is a (Continued)

(51) Int. Cl.

*H01L 33/38* (2010.01)
*H01L 33/40* (2010.01)

(Continued)

(52) U.S. Cl.

CPC ............ *H01L 33/46* (2013.01); *H01L 33/387* (2013.01); *H01L 33/405* (2013.01);

(Continued)

(58) Field of Classification Search

CPC ... H01L 33/145; H01L 33/382; H01L 33/387; H01L 33/405; H01L 33/46; H01L 2933/0025; H01L 2933/0016

See application file for complete search history.

(56) References Cited

U.S. PATENT DOCUMENTS

2010/0015742 A1* 1/2010 Fang ...................... H01L 33/44 438/46
2012/0043575 A1 2/2012 Kim et al.

(Continued)

FOREIGN PATENT DOCUMENTS

CN 106684219 A 5/2017

OTHER PUBLICATIONS

Search Report appended to an Office Action, which was issued to Chinese counterpart application No. 201880003521.9 by the CNIPA on Dec. 3, 2020 with an English translation thereof.

*Primary Examiner* — Yu Chen

(74) *Attorney, Agent, or Firm* — Thomasl Horstemeyer, LLP

(57) ABSTRACT

Disclosed is a light-emitting diode which includes a light-emitting epitaxial layered unit, an insulation layer, a transparent conductive layer, a protective layer, a first electrode, and a second electrode. The light-emitting epitaxial layered unit includes a first semiconductor layer, a second semiconductor layer, and a light-emitting layer sandwiched between the first and second semiconductor layers, and has a first electrode region which includes a pad area and an extension area. The insulation layer is disposed on the first semiconductor layer and at the extension area of the first electrode region. Also disclosed is a method for manufacturing the light-emitting diode.

17 Claims, 26 Drawing Sheets

252C 252 B A 243 244 241 251 221 222 254 246 245 242 A B 243 244A 244B 244C 244 222 251 252 221A 230A D1 D2 D3 D4 230 253 222 221 230A

Related U.S. Application Data continuation-in-part of application No. PCT/CN2018/073362, filed on Jan. 19, 2018.

(51) Int. Cl.
*H01L 33/46* (2010.01)
*H01L 33/14* (2010.01)

(52) U.S. Cl.
CPC .......... *H01L 33/145* (2013.01); *H01L 33/382* (2013.01); *H01L 2933/0016* (2013.01); *H01L 2933/0025* (2013.01)

(56) References Cited

U.S. PATENT DOCUMENTS

2016/0260869 A1 9/2016 Jeon et al.
2017/0110629 A1 4/2017 Suh et al.
2017/0365745 A1 12/2017 Yang et al.
2018/0153007 A1 5/2018 Kim et al.
2019/0115511 A1 4/2019 Lin et al.
2021/0098649 A1 4/2021 Park et al.

* cited by examiner

LIGHT-EMITTING DIODE AND METHOD FOR MANUFACTURING THE SAME

CROSS-REFERENCE TO RELATED APPLICATION

This application is a continuation application of U.S. patent application Ser. No. 16/931,056, filed on Jul. 16, 2020, which is a bypass continuation-in-part application of International Application No. PCT/CN2018/073362 filed on Jan. 19, 2018. The entire content of each of the international and U.S. patent applications is incorporated herein by reference.

FIELD

The disclosure relates to a light-emitting diode and a method for manufacturing the light-emitting diode.

BACKGROUND

Light emitting diodes (LEDs) have advantages properties, such as long lifespan, small size, high shock resistance, low heat generation, low power consumption, and etc., and thus are widely used as indicators or light sources of home appliances and various instruments.

A conventional method for manufacturing a gallium nitride LED chip generally includes four steps, i.e., mesa etching, forming a transparent conductive layer (for example, an indium tin oxide layer), forming electrodes, and forming a protective layer. The LED chip thus manufactured is illustrated in FIG. 1.

As shown in FIG. 1, the LED chip generally includes a substrate 101, an n-type layer 111, a light-emitting layer 112, a p-type layer 113, a transparent conductive layer 120, a p-electrode 141, an n-electrode 142, and a protective layer 130. The p-electrode 141 includes a pad 143 and an extension strip 144.

In a conventional gallium nitride LED, p-GaN has a relatively low carrier mobility, such that current crowding effect may occur at the bottom of a pad-pad.

Therefore, referring to FIG. 2, a current blocking layer 150 is usually added below the p-type electrode 141 to suppress over-injection of current and to increase current spreading of the transparent conductive layer 120. A conventional method for manufacturing the LED chip as shown in FIG. 2 generally includes five steps, i.e., mesa etching, forming a current blocking layer, forming a current spreading layer (for example, an indium tin oxide layer), forming electrodes, and forming a protective layer.

SUMMARY

An object of the disclosure is to provide a light-emitting diode and a manufacturing method thereof, in which a protective layer, a transparent conductive layer, and an insulation layer are formed below an extension portion of an electrode, so as to effectively enhance the light-emitting efficiency and the reliability of the light-emitting diode.

According to a first aspect of the disclosure, there is provided a light emitting diode which includes a light-emitting epitaxial layered unit, an insulation layer, a transparent conductive layer, a protective layer, a first electrode, and a second electrode.

The light-emitting epitaxial layered unit includes a first semiconductor layer, a second semiconductor layer, and a light-emitting layer sandwiched between the first and second semiconductor layers, and has a top surface including a first electrode region. The first electrode region includes a pad area and an extension area.

The insulation layer is disposed on the first semiconductor layer and at the extension area of the first electrode region.

The transparent conductive layer is disposed on the first semiconductor layer and covers the insulation layer.

The protective layer is disposed on the transparent conductive layer, and has a plurality of first holes formed above and along the extension area of the first electrode region to permit the transparent conductive layer to be exposed.

The first electrode is disposed on the protective layer, and includes a pad portion and an extension portion. The extension portion fills the first holes so as to electrically connect the transparent conductive layer.

The second electrode is electrically connected to the second semiconductor layer and is spaced apart from the first electrode.

According to a second aspect of the disclosure, there is provided a light emitting diode which includes a light-emitting epitaxial layered unit, an insulation layer, a transparent conductive layer, a protective layer, a first electrode, and a second electrode.

The light-emitting epitaxial layered unit includes a first semiconductor layer, a second semiconductor layer, and a light-emitting layer sandwiched between the first and second semiconductor layers, and has a top surface including a first electrode region and a second electrode region. The second electrode region includes a pad area and an extension area. The light-emitting epitaxial layered unit has a plurality of vias. Each of the vias extends downwardly from the extension area of the second electrode region through the first semiconductor layer and the light-emitting layer to terminate at a bottom surface in the second semiconductor layer so as to permit the second semiconductor layer to be exposed.

The insulation layer is disposed on the pad area and the extension area of the second electrode region.

The transparent conductive layer is disposed on the first semiconductor layer, and has a plurality of holes which are in positions corresponding to those of the vias, respectively.

The protective layer is disposed on the transparent conductive layer, and extends downwardly along an inner peripheral surface of each of the vias to terminate at the bottom surface of each of the vias to permit the second semiconductor layer to be exposed.

The first electrode is disposed on the protective layer and at the first electrode region, and is electrically connected to the transparent conductive layer.

The second electrode is disposed on the protective layer and at the second electrode region, and fills the vias so as to electrically connect the second semiconductor layer.

According to a third aspect of the disclosure, there is provided a method for manufacturing a light-emitting diode, which includes the steps of:

a) providing a light-emitting epitaxial layered unit which includes a first semiconductor layer, a second semiconductor layer, and a light-emitting layer sandwiched between the first and second semiconductor layers, the light-emitting epitaxial layered unit having a top surface including a first electrode region which includes a pad area and an extension area;

b) forming an insulation layer on the extension area of the first electrode region of the top surface of the light-emitting epitaxial layered unit;

c) forming a transparent conductive layer on the insulation layer and the top surface of the light-emitting epitaxial layered unit;

d) forming a protective layer on the transparent conductive layer, the protective layer being formed with a plurality of first holes above and along the extension area of the first electrode region to permit the transparent conductive layer to be exposed; and e) forming a first electrode on the protective layer, the first electrode filling the first holes so as to electrically connect the transparent conductive layer.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
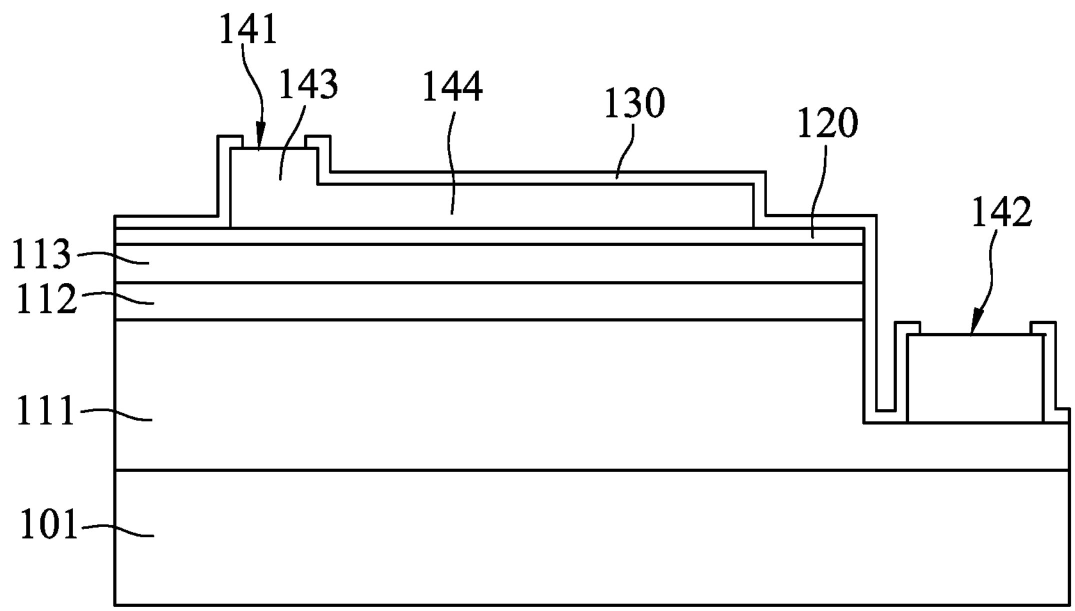
FIG. 1 is a schematic side view of a conventional light-emitting diode.

Before the disclosure is described in greater detail, it should be noted that where considered appropriate, reference numerals or terminal portions of reference numerals have been repeated among the figures to indicate corresponding or analogous elements, which may optionally have similar characteristics.

A light emitting diode according to a first aspect of the disclosure includes a light-emitting epitaxial layered unit, an insulation layer, a transparent conductive layer, a protective layer, a first electrode, and a second electrode.

The light-emitting epitaxial layered unit includes a first semiconductor layer, a second semiconductor layer, and a light-emitting layer sandwiched between the first and second semiconductor layers, and has a top surface including a first electrode region. The first electrode region includes a pad area and an extension area.

The insulation layer is disposed on the first semiconductor layer and at the extension area of the first electrode region.

The transparent conductive layer is disposed on the first semiconductor layer and covers the insulation layer.

The protective layer is disposed on the transparent conductive layer, and has a plurality of first holes formed above and along the extension area of the first electrode region to permit the transparent conductive layer to be exposed.

The first electrode is disposed on the protective layer, and includes a pad portion and an extension portion. The extension portion fills the first holes so as to electrically connect the transparent conductive layer.

The second electrode is electrically connected to the second semiconductor layer and is spaced apart from the first electrode.

Each of the insulation layer and the protective layer has a thickness which is determined according to an equation of:

$$d=(2k+1)\Lambda/4n,$$

wherein d is a thickness of each of the insulation layer and the protective layer, k is a natural number of at least 0, Λ is a wavelength of light emitted from the light-emitting layer, and n is a refractive index of each of the insulation layer and the protective layer.

In certain embodiments, a total thickness of the insulation layer and the protective layer is at least 300 nm.

In certain embodiments, the insulation layer includes a plurality of insulation blocks spaced apart from one another.

In certain embodiments, the insulation blocks of the insulation layer are in positions corresponding to those of the first holes of the protective layer, respectively. Each of the insulation blocks of the insulation layer has a cross-sectional area smaller than a size of a corresponding one of the first holes of the protective layer.

In certain embodiments, the transparent conductive layer covers the insulation blocks of the insulation layer, and the transparent conductive layer and the protective layer define therebetween a plurality of clearances which are in positions corresponding to those of the first holes, respectively, to permit the first electrode to be filled.

In certain embodiments, each of the insulation blocks of the insulation layer is disposed below a corresponding one of the first holes of the protective layer, and has a cross-sectional area larger than a size of a corresponding one of the first holes of the protective layer.

In certain embodiments, a proximate one of the insulation blocks relative to the pad area of the first electrode region have a cross-sectional area larger than that of a distal one of the insulation blocks relative to the pad area of the first electrode region.

In certain embodiments, proximate ones of the insulation blocks relative to the pad area of the first electrode region are arranged more densely than distal ones of the insulation blocks relative to the pad area of the first electrode region.

In certain embodiments, a part of the pad portion of the first electrode is in direct contact with a portion of the first semiconductor layer at the pad area of the first electrode region.

In certain embodiments, the pad area of the first electrode region includes a central portion, and a part of the pad portion of the first electrode is in direct contact with a portion of the first semiconductor layer at the central portion of the pad area of the first electrode region.

In certain embodiments, the insulation layer is further disposed at the pad area of the first electrode region.

In certain embodiments, the protective layer further has a second hole disposed above the first semiconductor layer at the pad area of the first electrode region.

In certain embodiments, the second hole has an annular geometry.

In certain embodiments, the transparent conductive layer has a third hole disposed above the pad area of the first electrode region, and the first electrode fills the second hole of the protective layer and the third hole of the transparent conductive layer so as to permit the first electrode to be in direct contact with a portion of the first semiconductor layer at the pad area of the first electrode region.

In certain embodiments, the second hole includes at least one hole-protruding portion that protrudes radially and outwardly.

In certain embodiments, the insulation layer is further disposed on the first semiconductor layer at the pad area of the first electrode region. The insulation layer at the pad area of the first electrode region includes a plurality of insulation blocks which are arranged to surround a center of the pad area of the first electrode region and which are angularly spaced apart from one another.

In certain embodiments, two adjacent ones of the insulation blocks at the pad area of the first electrode region define therebetween a clearance, and the first electrode further includes an interconnecting portion which interconnect the pad portion and the extension portion and which is disposed above a corresponding one of the clearances.

In certain embodiments, the protective layer further has a second hole disposed above the first semiconductor layer at the pad area of the first electrode region. The second hole includes at least one hole-protruding portion that protrudes radially and outwardly.

In certain embodiments, the second hole includes a plurality of the hole-protruding portions respectively aligned with the insulation blocks at the pad area of the first electrode region.

In certain embodiments, the second hole includes a plurality of the hole-protruding portions which are staggered from the insulation blocks disposed at the pad area of the first electrode region.

In certain embodiments, the top surface of the light-emitting epitaxial layered unit further includes a second electrode region on which the second electrode is disposed. The second electrode region includes a mesa portion at which the second semiconductor layer is exposed. The protective layer covers the mesa portion, and further has a fourth hole to permit a part of the second semiconductor layer to expose.

In certain embodiments, the insulation layer is further disposed on the pad area of the second electrode region and is sandwiched between the protective layer and the second semiconductor layer.

In certain embodiments, the top surface of the light-emitting epitaxial layered unit further includes a second electrode region configured as a mesa-shaped surface on which the second electrode is disposed. The second electrode includes an extension portion which is disposed on the protective layer and which extends downwardly to penetrate through the first semiconductor layer and the light-emitting layer so as to form an ohmic contact with the second semiconductor layer.

In certain embodiments, the insulation layer, the transparent conductive layer, and the protective layer are laminated sequentially on the first semiconductor layer, and are disposed between the extension portion of the second electrode and the first semiconductor layer.

In certain embodiments, the transparent conductive layer and the protective layer are laminated sequentially on the first semiconductor layer, and are disposed between the extension portion of the second electrode and the first semiconductor layer.

In certain embodiments, the first electrode has an undulating top surface.

In certain embodiments, the pad portion of the first electrode has a stepped top surface.

In certain embodiments, the pad portion of the first electrode has a recessed top surface.

In certain embodiments, the recessed top surface of the pad portion of the first electrode has at least two recesses.

In certain embodiments, the recessed top surface of the pad portion of the first electrode has a central recess and a surrounding recess surrounding the central recess.

In certain embodiments, the central recess is deeper than the surrounding recess.

A light emitting diode according to a second aspect of the disclosure includes a light-emitting epitaxial layered unit, an insulation layer, a transparent conductive layer, a protective layer, a first electrode, and a second electrode.

The light-emitting epitaxial layered unit includes a first semiconductor layer, a second semiconductor layer, and a light-emitting layer sandwiched between the first and second semiconductor layers, and has a top surface including a first electrode region and a second electrode region. The second electrode region includes a pad area and an extension area. The light-emitting epitaxial layered unit has a plurality of vias. Each of the vias extends downwardly from the extension area of the second electrode region through the first semiconductor layer and the light-emitting layer to terminate at a bottom surface in the second semiconductor layer so as to permit the second semiconductor layer to be exposed.

The insulation layer is disposed on the pad area and the extension area of the second electrode region.

The transparent conductive layer is disposed on the first semiconductor layer, and has a plurality of holes which are in positions corresponding to those of the vias, respectively.

The protective layer is disposed on the transparent conductive layer, and extends downwardly along an inner peripheral surface of each of the vias to terminate at the bottom surface of each of the vias to permit the second semiconductor layer to be exposed.

The first electrode is disposed on the protective layer and at the first electrode region, and is electrically connected to the transparent conductive layer.

The second electrode is disposed on the protective layer and at the second electrode region, and fills the vias so as to electrically connect the second semiconductor layer.

In certain embodiments, the insulation layer is further disposed on the extension area of the second electrode region, and the transparent conductive layer covers the insulation layer on the extension area of the second electrode region.

In certain embodiments, the first electrode includes a pad portion and an extension portion. The insulation layer, the transparent conductive layer, and the protective layer are laminated sequentially on the first semiconductor layer, and are disposed between the extension portion of the first electrode and the first semiconductor layer.

In certain embodiments, the pad portion of the first electrode is in direct contact with the first semiconductor layer.

In certain embodiments, the pad portion of the first electrode has a stepped top surface.

In certain embodiments, the extension portion of the first electrode has a stepped top surface.

In certain embodiments, the second electrode includes a pad portion and an extension portion, and the protective layer is disposed between the pad portion of the second electrode and the insulation layer.

A method for manufacturing a light-emitting diode according to a third aspect of the disclosure includes the steps of:

a) providing a light-emitting epitaxial layered unit which includes a first semiconductor layer, a second semiconductor layer, and a light-emitting layer sandwiched between the first and second semiconductor layers, the light-emitting epitaxial layered unit having a top surface including a first electrode region which includes a pad area and an extension area;

b) forming an insulation layer on the extension area of the first electrode region of the top surface of the light-emitting epitaxial layered unit;

c) forming a transparent conductive layer on the insulation layer and the top surface of the light-emitting epitaxial layered unit;

d) forming a protective layer on the transparent conductive layer, the protective layer being formed with a plurality of first holes above and along the extension area of the first electrode region to permit the transparent conductive layer to be exposed; and e) forming a first electrode on the protective layer, the first electrode filling the first holes so as to electrically connect the transparent conductive layer.

In certain embodiments, in step a), the light-emitting epitaxial layered unit has a plurality of vias, and the top surface of the light-emitting epitaxial layered unit further includes a second electrode region configured as a mesa-shaped surface from which the second semiconductor layer is exposed partially. In step d), the protective layer covers the mesa-shaped surface and is formed with a plurality of openings which are aligned with the vias, respectively, so as to permit the second semiconductor layer to be exposed. In step e), a second electrode is further formed on the protective layer, and fills the vias of the protective layer so as to be in contact with the second semiconductor layer.

In certain embodiments, in step e), the first electrode region is located on the first semiconductor layer, and the first electrode is formed directly on the pad area of the first electrode region so as to be in direct contact with the first semiconductor layer.

Figure 3:
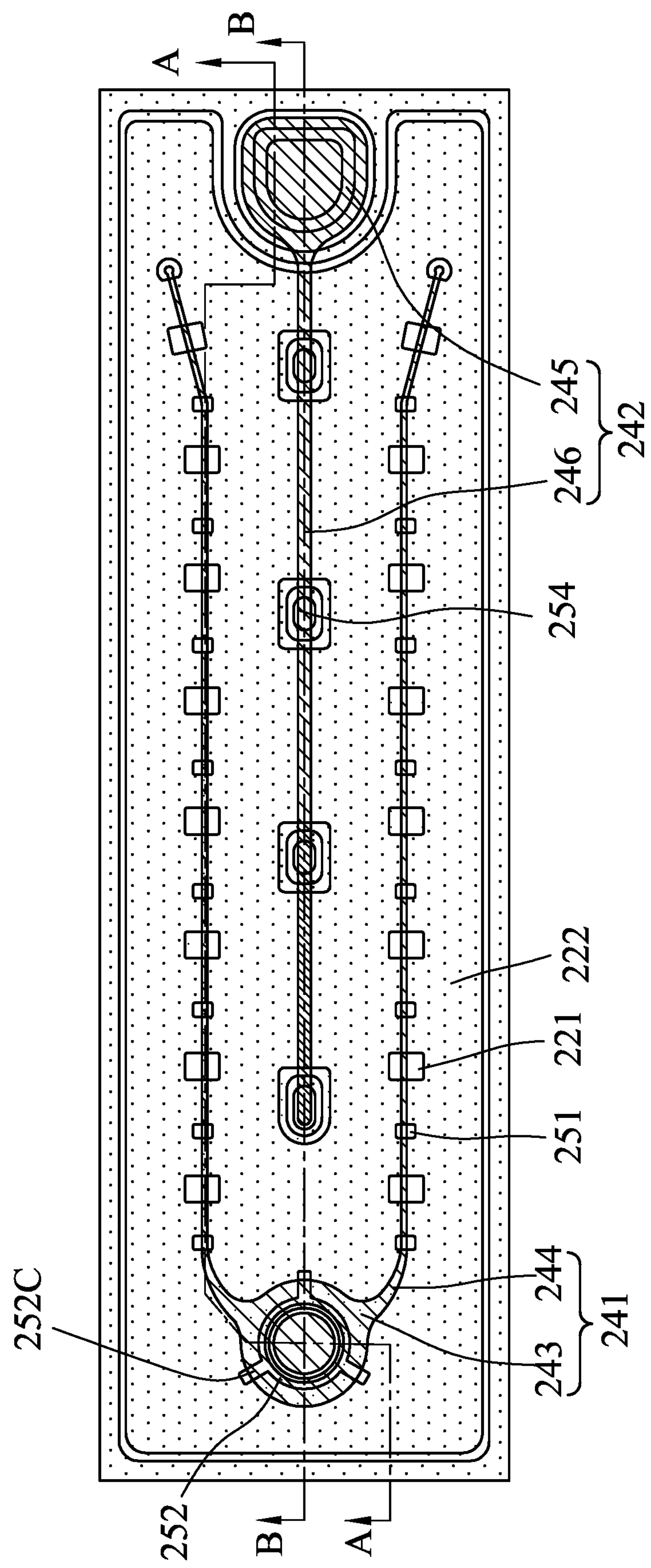
FIG. 3 is a schematic top view of a first embodiment of a light-emitting diode according to the disclosure.
Figure 4:
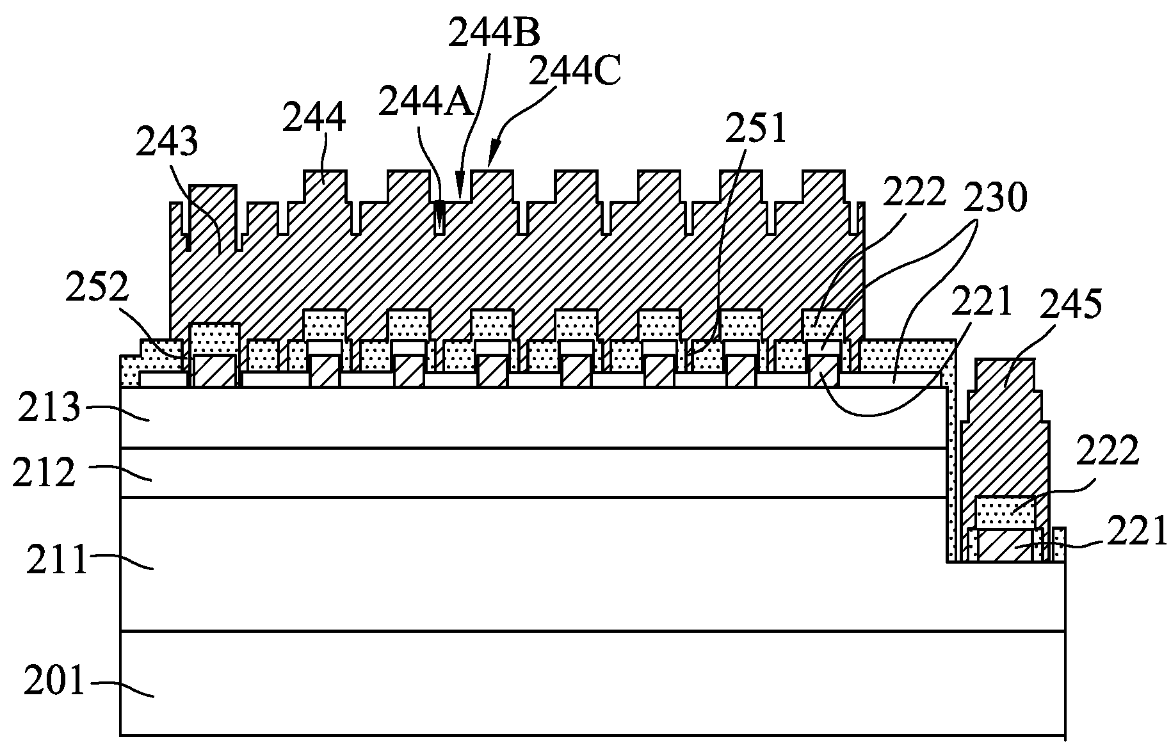
FIG. 4 is a schematic side view taken along line A-A of FIG. 3.
Figure 5:
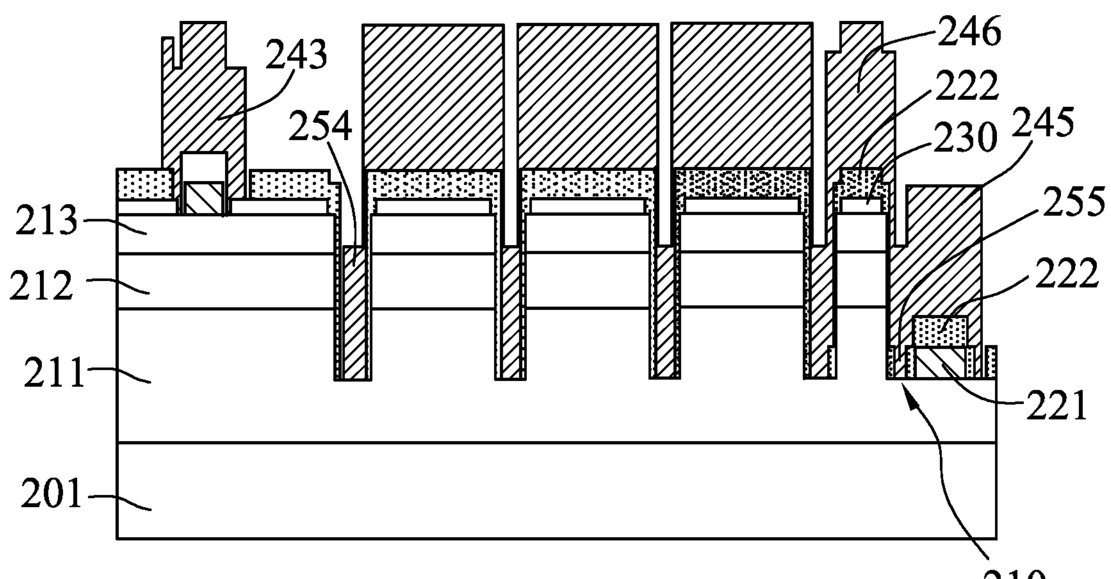
FIG. 5 is a schematic side view taken along line B-B of FIG. 3.

Referring to FIGS. 3 to 5, a first embodiment of a light-emitting diode according to the disclosure includes a substrate 201, an n-type layer 211, a light-emitting layer 212, a p-type layer 213, an insulation layer 221, a transparent conductive layer 230, a protective layer 222, a first electrode 241, and a second electrode 242. The first electrode 241 includes a pad portion 243 and an extension portion 244, and the second electrode 242 also includes a pad portion 245 and an extension portion 246.

The substrate may be made of sapphire, aluminum nitride, gallium nitride, silicon, silicon carbide, or the like, and may have a flat surface structure or a patterned surface structure. The n-type layer 211 is disposed on the substrate 201. The light-emitting layer 212 is disposed on the n-type layer 211. The p-type layer 213 is disposed on the light-emitting layer 212.

The n-type layer 211, the light-emitting layer 212, and p-type layer 213 cooperate with one another to form a light-emitting epitaxial layered unit. The light-emitting epitaxial layered unit has a top surface which includes a first electrode region and a second electrode region. Each of the first and second electrode regions includes a pad area and an extension area. The second electrode region is configured as a mesa-shaped surface 210 from which the n-type layer 211 is exposed partially, and has an upper surface portion and a lower surface portion.

The light-emitting epitaxial layered unit has a plurality of vias 254. Each of the vias 254 extends downwardly from the extension area of the second electrode region through the p-type layer 213 and the light-emitting layer 212 to terminate at a bottom surface in the n-type layer 211 so as to permit the n-type 211 to be exposed.

The insulation layer 221 is disposed below the first electrode 241. Specifically, the insulation layer 221 is disposed on the p-type layer 213 and at the pad area and the extension area of the first electrode region. The insulation layer 221 disposed at the extension area of the first electrode region includes a plurality of insulation blocks spaced apart from one another. In addition, the insulation layer 221 is further disposed on the pad area of the second electrode region. The insulation layer 221 disposed on the pad area of the second electrode region is sandwiched between the protective layer 222 and the n-type layer 211.

The transparent conductive layer 230 is disposed on the p-type layer 213 and covers the insulation layer 221.

The protective layer 222 is disposed on the transparent conductive layer 230, and has a plurality of first holes 251 formed above and along the extension area of the first electrode region to permit the transparent conductive layer 230 to be exposed. In the first embodiment, the protective layer 222 substantially covers the top surface of the light-emitting epitaxial layered unit. The protective layer 222 further has a second hole 252 disposed above the p-type layer 213 at the pad area of the first electrode region. In addition, the protective layer 222 covers the mesa-shaped surface 210 and further has a fourth hole 255 on the lower surface portion of the mesa-shaped surface 210.

The first electrode 241 is disposed on the protective layer 222. The extension portion 244 of the first electrode 241 fills the first holes 251 so as to electrically connect the transparent conductive layer 230. In addition, the pad portion 243 of the first electrode 241 is in contact with the transparent conductive layer 230 through the second hole 252.

The second electrode 242 is disposed on the mesa-shaped surface, is electrically connected to the n-type 211, and is spaced apart from the first electrode 241. The pad portion 245 of the second electrode 242 is disposed on the lower surface portion of the mesa-shaped surface 210, and is in contact with the n-type layer 211 through the fourth hole 255. The extension portion 246 of the second electrode 242 is disposed on the protective layer 222 and extends downwardly to be in contact with the n-type layer 211 through the vias 254.

Referring specifically to FIG. 4, the insulation layer 221, the transparent conductive layer 230, and the protective layer 222 are laminated sequentially on the p-type layer 213, and are disposed between the extension portion 244 of the first electrode 241 and the p-type layer 213.

The material for making each of the insulation layer 221 and the protective layer 222 may be an insulation material having a low refractive index (for example, at most 1.5). The materials for making the insulation layer 221 and the protective layer 222 may be the same or different.

The first holes 251 of the protective layer 222 are staggered from the insulation blocks of the insulation layer 221. The extension portion 244 of the first electrode 241 has a stepped top surface including a first surface 244A, a second surface 244B, and a third surface 244C.

The insulation layer 221 below the extension portion 244 of the first electrode 241 may be used as a current blocking layer so as to inhibit the over-injection of current below the extension portion 244 of the first electrode 241 and to increase the length and uniformity of the current injection.

The protective layer 222 is formed on the transparent conducting layer 230, followed by formation of the first electrode 241. Therefore, the probability of the active metal in the first electrode 241 being oxidized during formation of the protective layer 222 may be reduced.

The design of the insulation layer 221 and the protective layer 222 can reduce the metal light-blocking area of the first electrode 241 and/or the second electrode 242 and the pad area(s) of the first electrode region and/or the second electrode region by utilizing the refraction effect, and thus improve the light extraction efficiency of the light-emitting diode. In addition, The insulation layer 221, the transparent conductive layer 230, the protective layer 222, and the electrode extension portion 244 of the first electrode 241 and/or the electrode extension portion 246 of the second electrode 242 are designed to act as an omni-directional reflector, so that the reflection capability of the first and second electrodes 241, 242 and the extension area thereof may be improved and the light absorption effect may be reduced.

Figure 2:
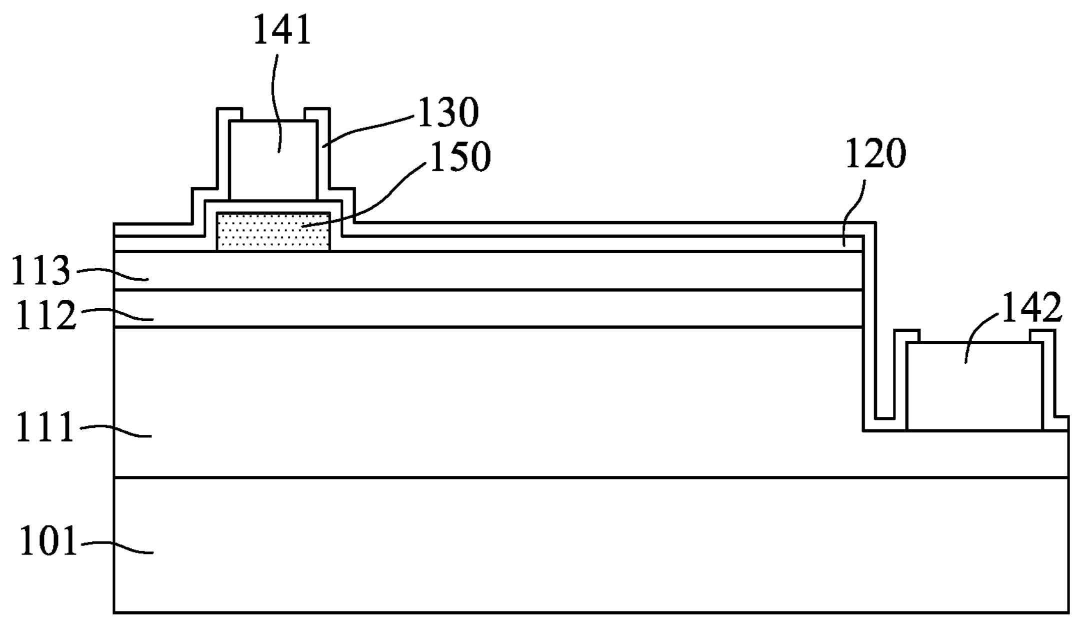
FIG. 2 is a schematic side view of another conventional light-emitting diode.
Figure 6:
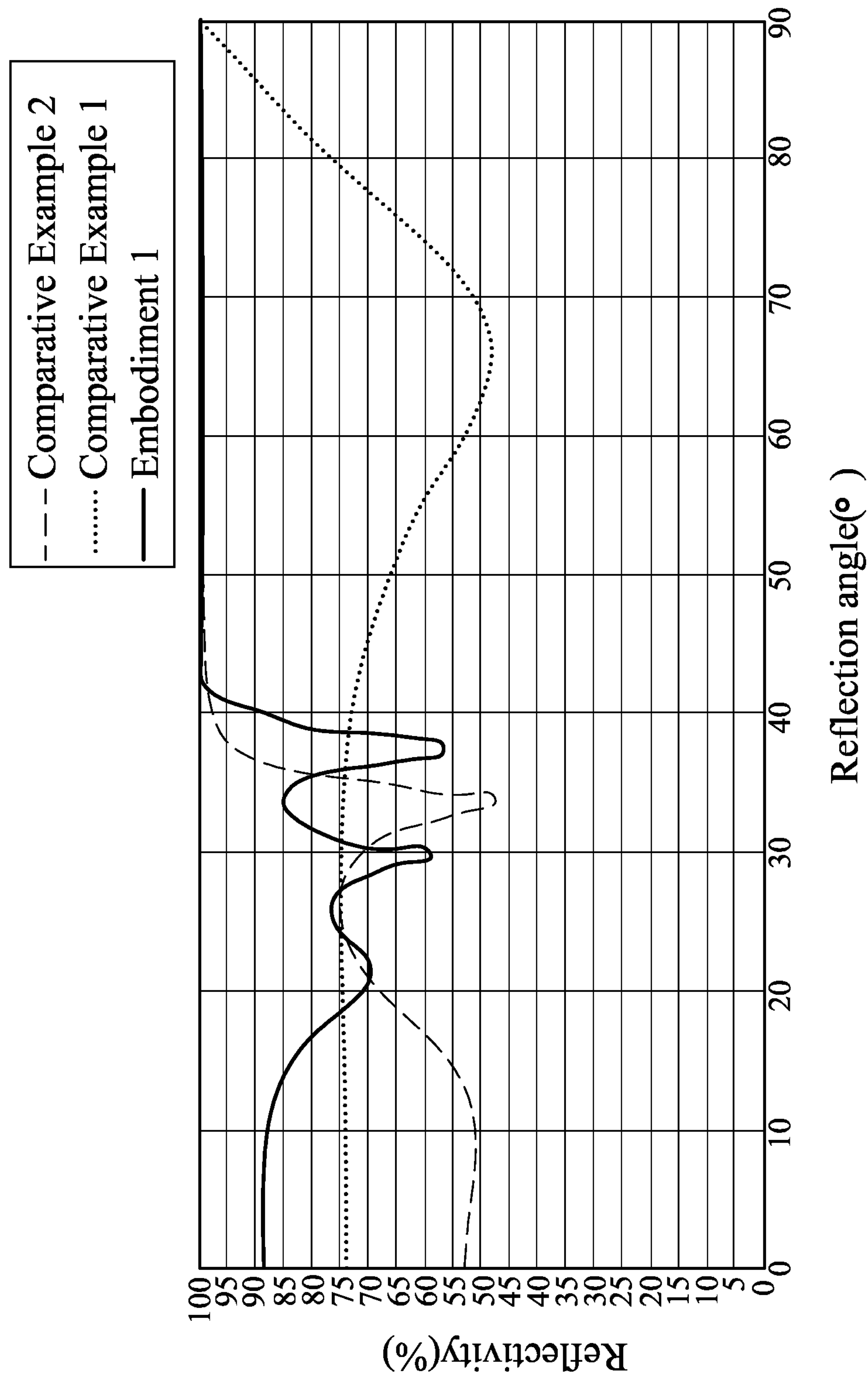
FIG. 6 is a diagram comparing reflectivity of the light-emitting diode of the first embodiment shown in FIG. 3 and those of the conventional light-emitting diodes shown in FIGS. 1 and 2 (referred to as Comparative Examples 1 and 2, respectively in the figure)

Referring to FIG. 6, the overall reflection efficiency of the first embodiment of the light-emitting diode according to the disclosure is superior to those of the conventional light-emitting diodes shown in FIGS. 1 and 2.

The protective layer 222 may be made of $SiO_2$, $SiN_4$, $Al_2O_3$, $TiO_2$, or the like, to protect the light-emitting diode from being damaged. Alternatively, the protective layer 222 may be used together with the insulation layer 221 as a complex current blocking layer for inhibiting the over-injection of current below the first electrode 241 and for increasing the current spreading of the transparent conductive layer 230.

The protective layer 222 has a thickness which is determined according to an equation of:

$$d=(2k+1)\Lambda/4n,$$

wherein d is a thickness of the protective layer 222, k is a natural number of at least 0 (for example, 1 or 2), Λ is a wavelength of light emitted from the light-emitting layer 212, and n is a refractive index of the protective layer 222.

The suitable thickness of the protective layer 222 ranges from 150 nm to 500 nm. When the thickness of the protective layer 222 is too small, the current blocking effect and the protection effect are insufficient. When the protective layer 222 is too large, the light emitted from the light-emitting layer 212 may be excessively absorbed by the protective layer 222, such that the light-emitting efficiency of the light-emitting diode is reduced.

Figure 7:
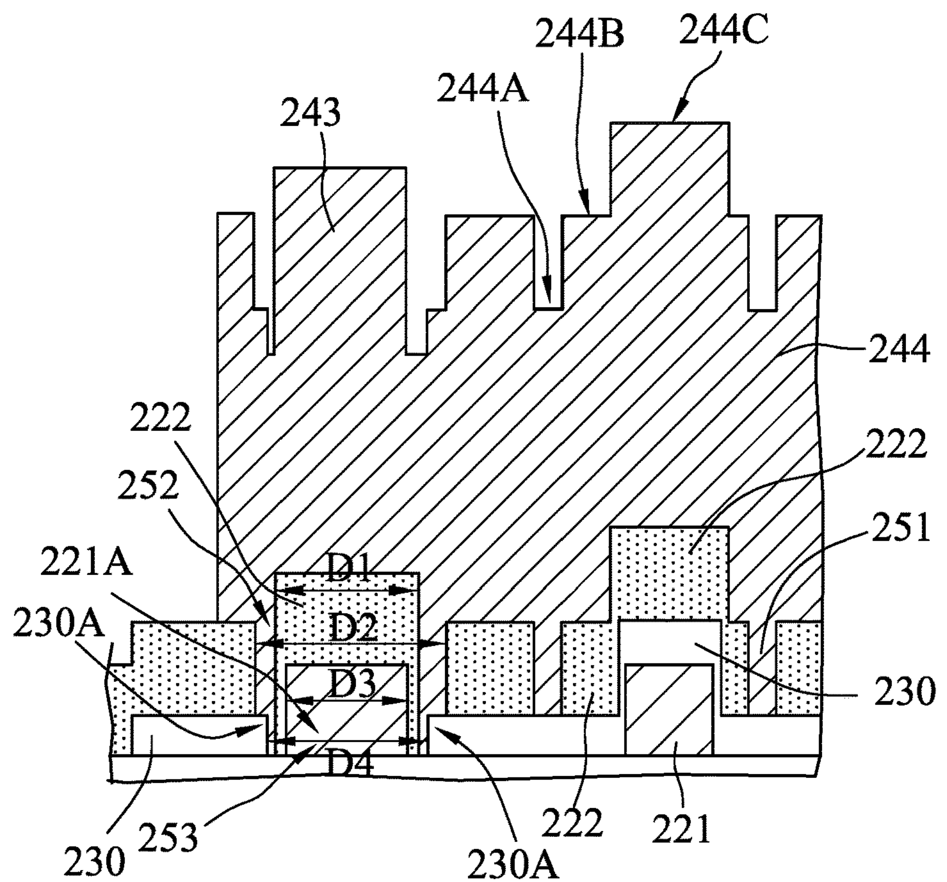
FIG. 7 is a partially enlarged schematic view of FIG. 4.

Referring to FIG. 7, the transparent conductive layer 230 has a third hole 253, which is disposed above the pad area of the first electrode region and which is in a position corresponding to that of the pad portion 243 of the first electrode 241. An insulation portion 221A of the insulation layer 221 is formed in the third hole 253. The insulation portion 221A has a diameter (D3) smaller than a diameter (D4) of the third hole 253. The second hole 252 of the protective layer 222 is in a position corresponding to that of the pad portion 243 of the first electrode 241. The second hole 252 is configured as an annular geometry which has an inner diameter (D1) and an outer diameter (D2). The inner diameter (D1) and the outer diameter (D2) of the second hole 252, the diameter (D3) of the insulation portion 221A, and the diameter (D4) of the third hole 253 have a relationship of D2>D4>D1>D3.

The pad portion 243 of the first electrode 241 fills the second hole 252 of the protective layer 222 and the third hole 253 of the transparent conductive layer 230 so as to permit the pad portion 243 of the first electrode 241 to be in direct contact with a portion of the p-type layer 213 at the pad area of the first electrode region. Specifically, the pad portion 243 of the first electrode 241 is in contact with the p-type layer 213, the transparent conductive layer 230, and the protective layer 222.

The pad portion 243 of the first electrode 241 has a stepped top surface. The protective layer 222 below the pad portion 243 of the first electrode 241 is used as a current blocking layer. When the current flows through the first electrode 241, most of the current flows from the extension portion 244 of the first electrode 241 through the first holes 251 of the protective layer 222 into the transparent conductive layer 230, and the remainder of the current flows from the pad portion 243 of the first electrode 241 into a transparent conductive portion 230A of the transparent conductive layer 230, followed by spreading in the transparent conductive layer 230 so as to inject into the light-emitting epitaxial layered unit.

In a variation of the first embodiment, the insulation portion 221A of the insulation layer 221 is not formed in the third hole 253 of the transparent conductive layer 230, and the protective layer 222 fills the third hole 253 directly.

In another variation of the first embodiment, the insulation portion 221A of the insulation layer 221 is not formed in the third hole 253 of the transparent conductive layer 230, the second hole 252 of the protective layer 222 is configured as a circular opening, the insulation layer 221 is not formed below the pad portion 243 of the first electrode 241, and the protective layer 222 is in direct contact with the p-type layer 213 to increase the contact area between the pad portion 243 of the first electrode 241 and the p-type layer 213, such that the adhesion between the pad portion 243 of the first electrode 241 and the p-type layer 213 may be enhanced so as to reduce the stripping risk of the first electrode 241 during wire bonding.

Referring specifically to FIG. 3, the second hole 252 of the protective layer 222 includes at least one hole-protruding portion 252*c* that protrudes radially and outwardly. The number of the hole-protruding portion 252*c* may range from 2 to 20. The pad portion 243 of the first electrode 241 is in contact with the transparent conductive layer 230 through the at least one hole-protruding portion 252*c*, so as to increase the contact area between the pad portion 243 of the first electrode 241 and the transparent conductive layer 230. Therefore, spreading of the current may be enhanced, such that current congestion effect on the pad portion 243 and the extension portion 244 of the first electrode 241 may be alleviated, thereby reducing the risks of metal precipitation and electrode burning.

In the first embodiment, the protective layer 222 of the light emitting diode protects the light emitting diode from being damaged, and can be directly used as a current blocking layer for inhibiting the over-injection of the current below the first and second electrodes 241, 242 and for increasing the current spreading of the transparent conductive layer 230. The first electrode 241 is in direct contact with the p-type layer 213 at the pad area of the first electrode region, so that the adhesion between the first electrode 241 and the light-emitting epitaxial layered unit is increased effectively, and the risk of the first electrode 241 being stripped during wire bonding may be reduced. The pad portion 243 of the first electrode 241 is designed as a multi-stepped configuration, such that the impact force of a welding wire can be buffered effectively, so as to reduce the impact and damage to the pad portion 243 of the first electrode 241 during the wire bonding. The extension portion 244 of the first electrode 241 is disposed on the protective layer 222, and extends through the first holes 251 of the protective layer 222 to be in contact with the transparent conductive layer 230, such that the extension portion 244 of the first electrode 241 is formed with an undulating and stepped configuration. Therefore, the light-emitting angle at the extension portion 244 of the first electrode 241 may be increased, and the light extraction efficiency may be enhanced.

In addition, the undulating and stepped configuration of the extension portion 244 of the first electrode 241 may reduce the contact area between the first electrode 241 and other objects, such that the damage to the extension portion 244 of the first electrode 241 during the subsequent procedures, such as inversion, transportation, and transfer, may be reduced effectively, and the dirt of the extension portion 244 of the first electrode 241 may be decreased as well.

Figure 8:
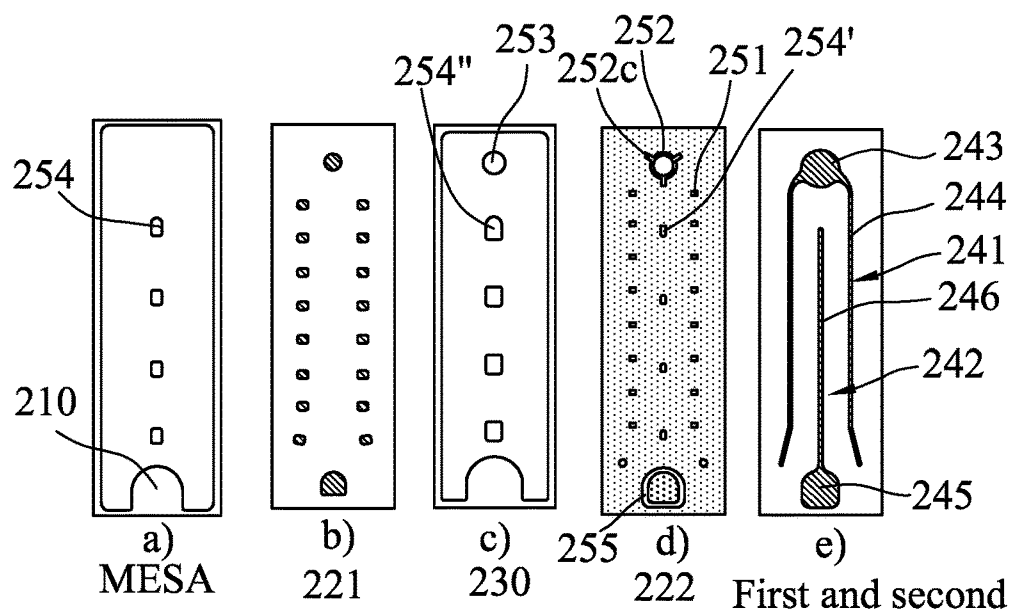
FIG. 8 is a schematic view illustrating photomasks for manufacturing the first embodiment shown in FIG. 3.

Referring to FIG. 8, a method for manufacturing the first embodiment of the light-emitting diode according to the disclosure includes the steps of a) providing the light-emitting epitaxial layered unit, b) forming the insulation layer 221, c) forming the transparent conductive layer 230, d) forming the protective layer 222, and e) forming the first and second electrodes 241, 242.

In step a), the light-emitting epitaxial layered unit is provided, which includes the substrate 201, the n-type layer 211, the light-emitting layer 212, and the p-type layer 213. The light-emitting layer 212 is sandwiched between the n-type layer 211 and the p-type layer 213. The light-emitting epitaxial layered unit is subjected to mesa etching to form a plurality of the vias 254 and a mesa-shaped surface 210. The light-emitting epitaxial layered unit has the top surface including the first electrode region and the second electrode region. The second electrode region has the mesa-shaped surface 210, from which the n-type layer 211 is exposed partially. Each of the first and second electrode regions includes the pad area and the extension area.

In step b), the insulation layer 221 is formed on the pad area and the extension area of the first electrode region and the pad area of the second electrode region of the top surface of the light-emitting epitaxial layered unit.

In step c), the transparent conductive layer 230 is formed on the insulation layer 221 and the top surface of the light-emitting epitaxial layered unit. The transparent conductive layer 230 is subjected to etching to remove a portion of the transparent conductive layer 230 at the pad area of the second electrode region and to form the third hole 253 at the pad area of the first electrode region and a plurality of openings 254" which are aligned with the vias 254, respectively.

In step d), the protective layer 222 is formed on the transparent conductive layer 230 and covers the mesa-shaped surface 210. The protective layer 222 is formed with a plurality of the first holes 251 above and along the extension area of the first electrode region to permit the transparent conductive layer 230 to be exposed. The protective layer 222 is formed with a plurality of openings 254' which are aligned with the vias 254, respectively so as to permit the second semiconductor layer 211 to be exposed. In addition, the protective layer 222 is further formed with the second hole 252 at the pad area of the first electrode region and the fourth hole 255 on the lower surface portion of the mesa-shaped surface 210.

In step e), the first electrode 241 and the second electrode 242 are formed on the protective layer 222. The first electrode 241 fills the first holes 251 of the protective layer 222 so as to electrically connect the transparent conductive layer 230. Specifically, the pad portion 243 of the first electrode 231 is in contact with the p-type layer 213, the transparent conductive layer 230, and the protective layer 222. The second electrode 242 fills the vias 254 so as to be in direct contact with the n-type layer 211.

In should be noted that there is no limitation to the geometry and the size of the second hole 252 of the protective layer 222. For example, in certain embodiments, the second hole 252 of the protective layer 222 is configured as a circular opening (i.e., the protective layer 222 below the pad portion 243 of the first electrode 241 is omitted), and the pad portion 243 of the first electrode 241 is formed directly on the pad area of the first electrode region so as to be in direct contact with the p-type layer 213 at a central portion of the pad area of the first electrode region. In certain embodiments, the second hole 252 of the protective layer 222 is composed of a plurality of protruding openings surrounding the periphery of the pad area of the first electrode region to expose the transparent conductive layer 230, and does not have an opening at the pad area of the first electrode region. The pad portion 243 of the first electrode 241 is formed on the protective layer 222 and is electrically connected to the transparent conductive layer 230 using metal leads passing through the protruding openings.

Figure 9:
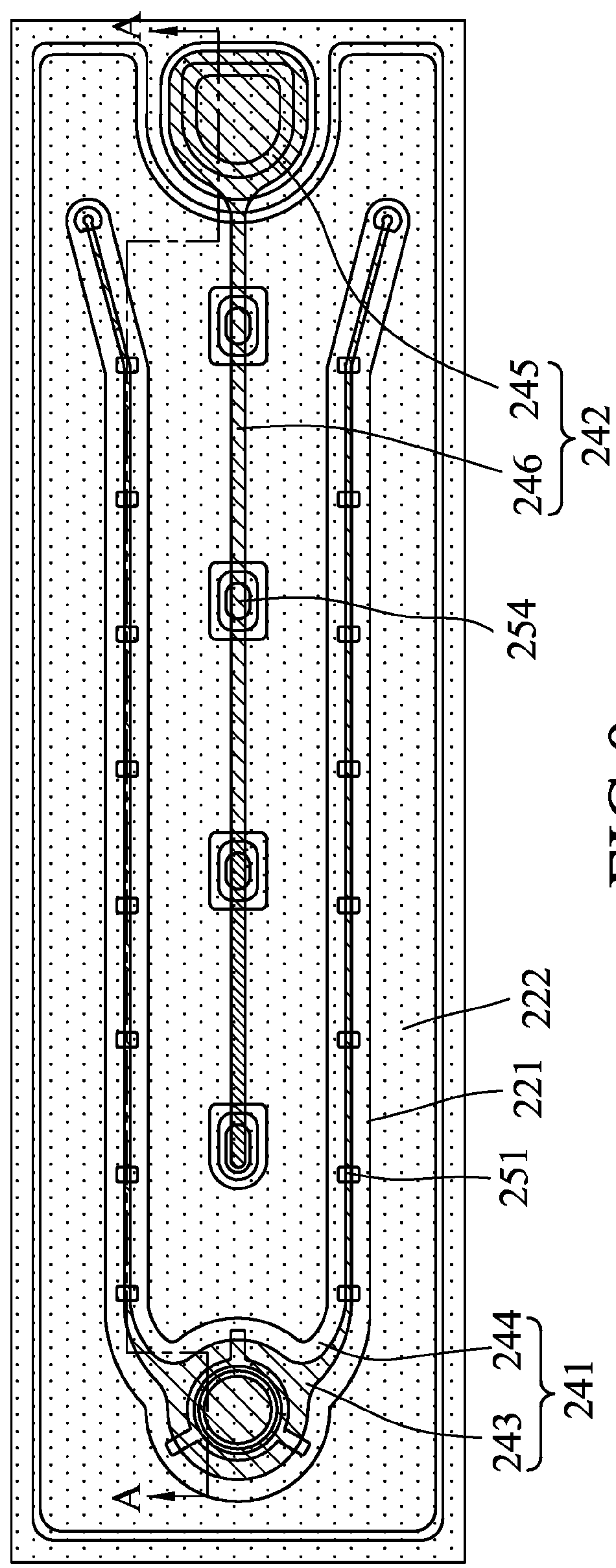
FIG. 9 is a schematic top view of a second embodiment of the light-emitting diode according to the disclosure.
Figure 10:
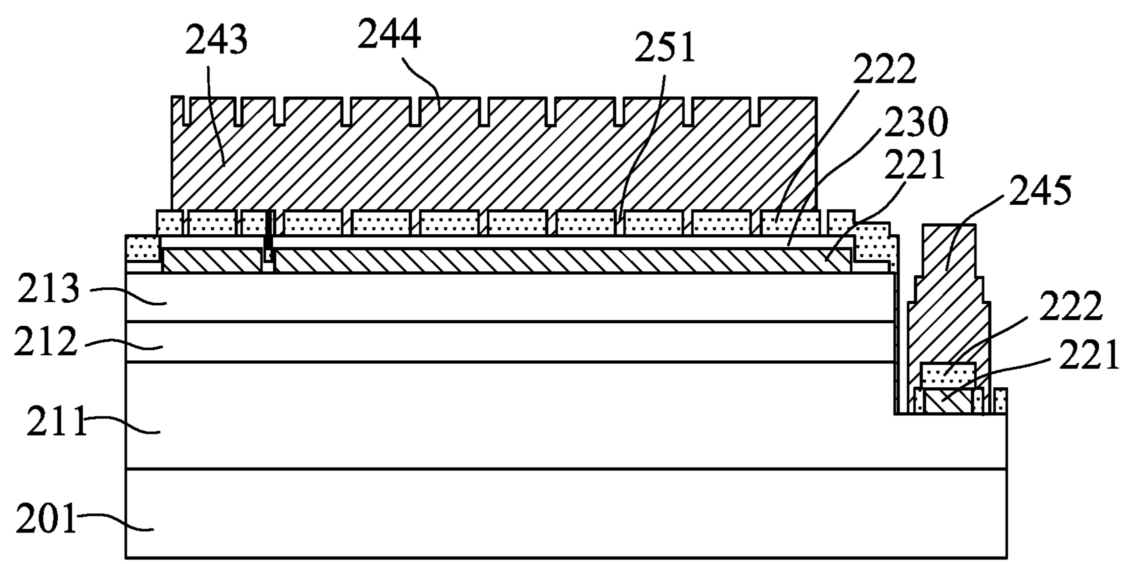
FIG. 10 is a schematic side view taken along line A-A of FIG. 9.

Referring to FIGS. 9 and 10, a second embodiment of the light-emitting diode according to the disclosure is similar to the first embodiment except that the insulation layer 221 below the extension portion 244 of the first electrode 241 is configured as an insulation extension strip, so that the current injection below the first electrode 241 may be completely avoided. In addition, the height of the extension portion 244 of the first electrode 241 is raised, such that the light blocking area of the metal of the extension portion 244 of the first electrode 241 can be reduced effectively by the refraction effect, thereby improving the light extraction efficiency of the light-emitting diode.

Figure 11:
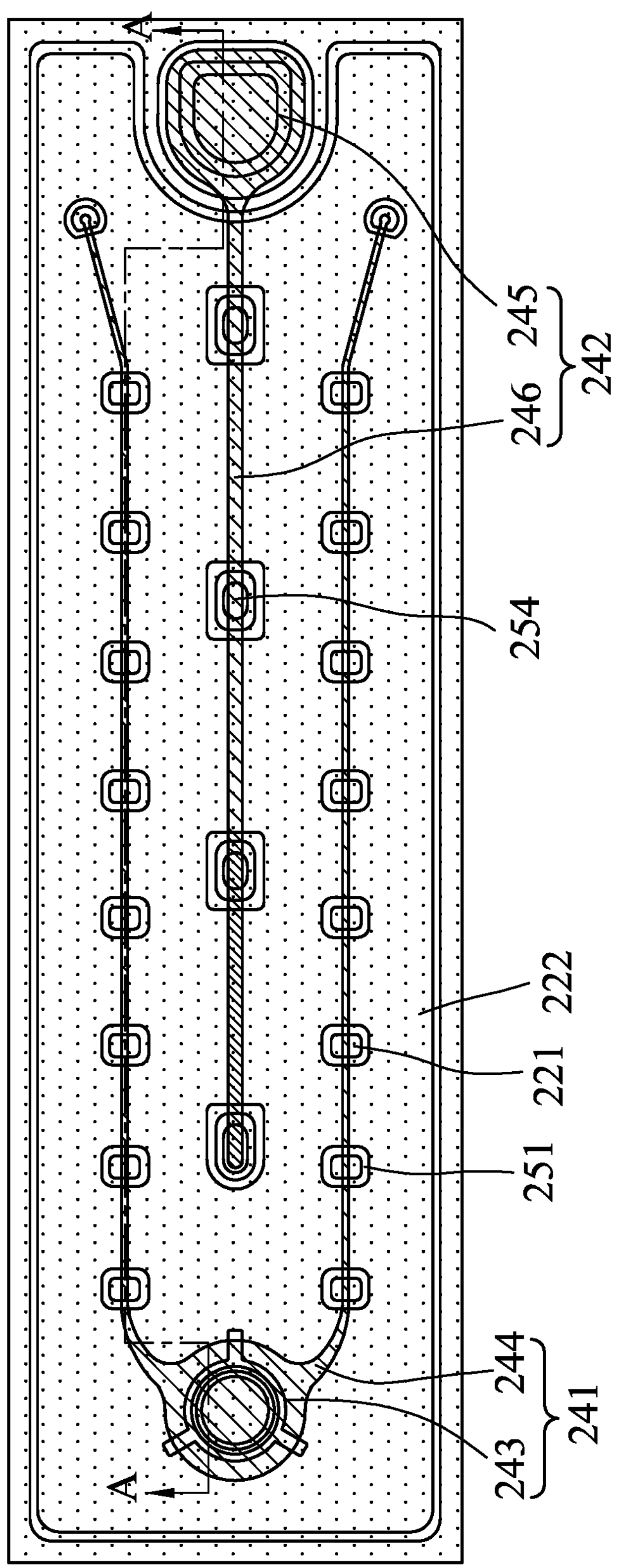
FIG. 11 is a schematic top view of a third embodiment of the light-emitting diode according to the disclosure.
Figure 12:
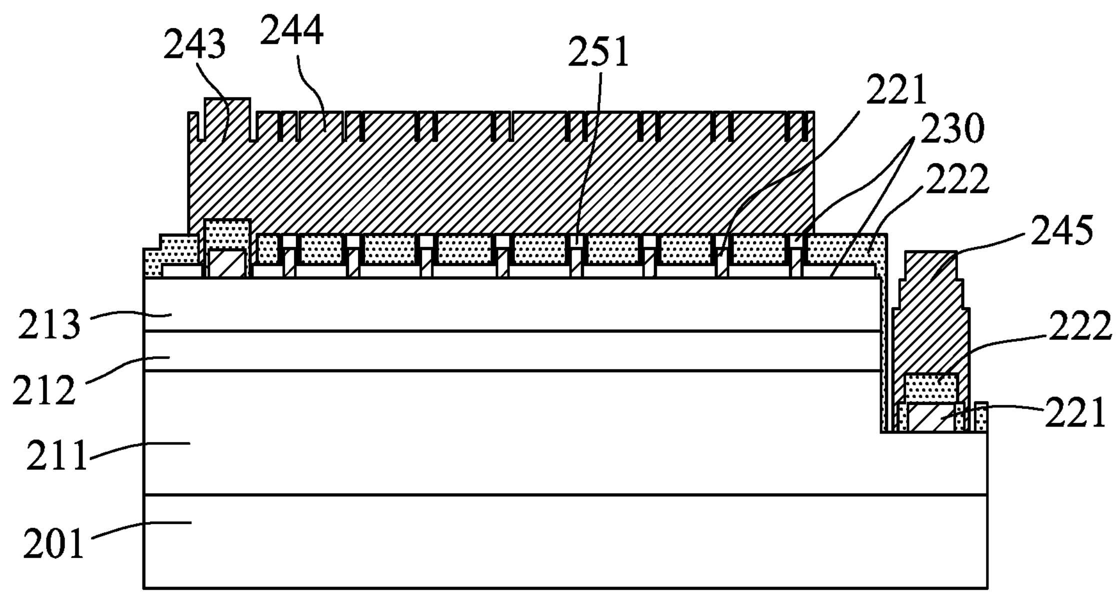
FIG. 12 is a schematic side view taken along line A-A of FIG. 11.
Figure 13:
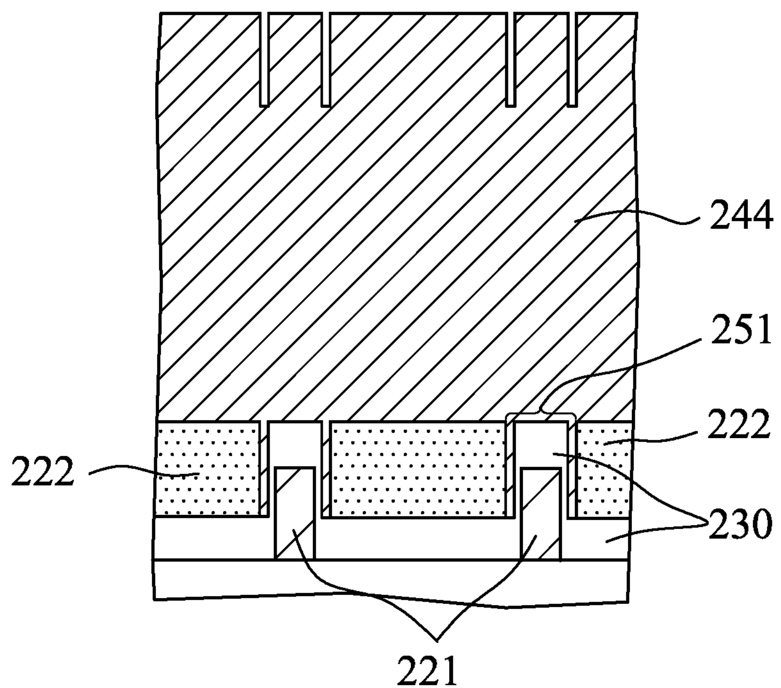
FIG. 13 is a partially enlarged schematic view of FIG. 12.

Referring to FIGS. 11 to 13, a third embodiment of the light-emitting diode according to the disclosure is similar to the first embodiment except for the following differences.

In the third embodiment, the insulation blocks of the insulation layer 221 are in positions corresponding to those of the first holes 251 of the protective layer 222, respectively. Each of the insulation blocks of the insulation layer 221 has a cross-sectional area smaller than a size of a corresponding one of the first holes 251 of the protective layer 222.

Referring specifically to FIG. 13, the transparent conductive layer 230 covers the insulation layer 221, and the transparent conductive layer 230 and the protective layer 222 define therebetween a plurality of clearances which are in positions corresponding to those of the first holes 251, respectively, to permit the extension portion 244 of the first electrode 241 to be filled. Therefore, the adhesion between the extension portion 244 of the first electrode 241 and the protective layer 222 is enhanced so as to prevent the extension portion 241 of the first electrode 241 from stripping. In addition, the contact area between the extension portion 244 of the first electrode 241 and the transparent conductive layer 230 is increased, which is beneficial to current spreading, thereby alleviating the current congestion effect on the pad portion 243 and the extension portion 244 of the first electrode 241, and reducing the risk of metal precipitation and electrode burning.

Figure 14:
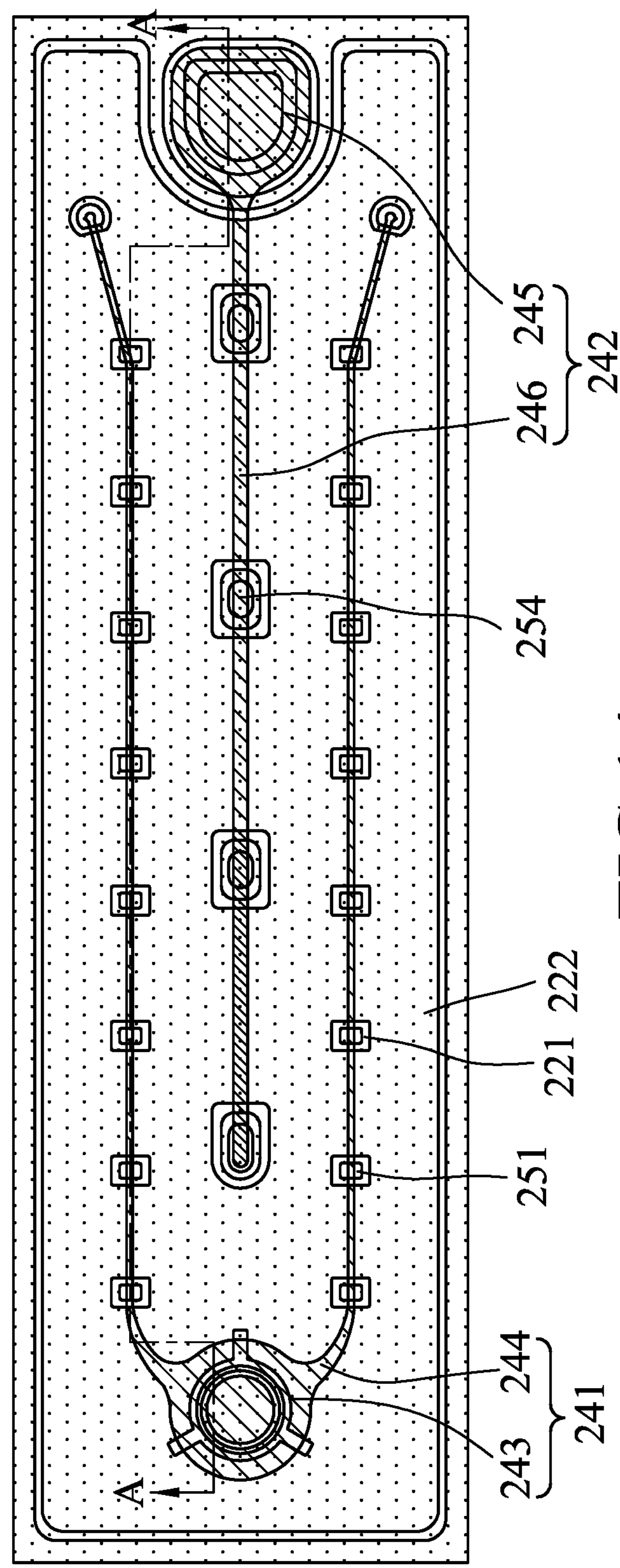
FIG. 14 is a schematic top view of a fourth embodiment of the light-emitting diode according to the disclosure.
Figure 15:
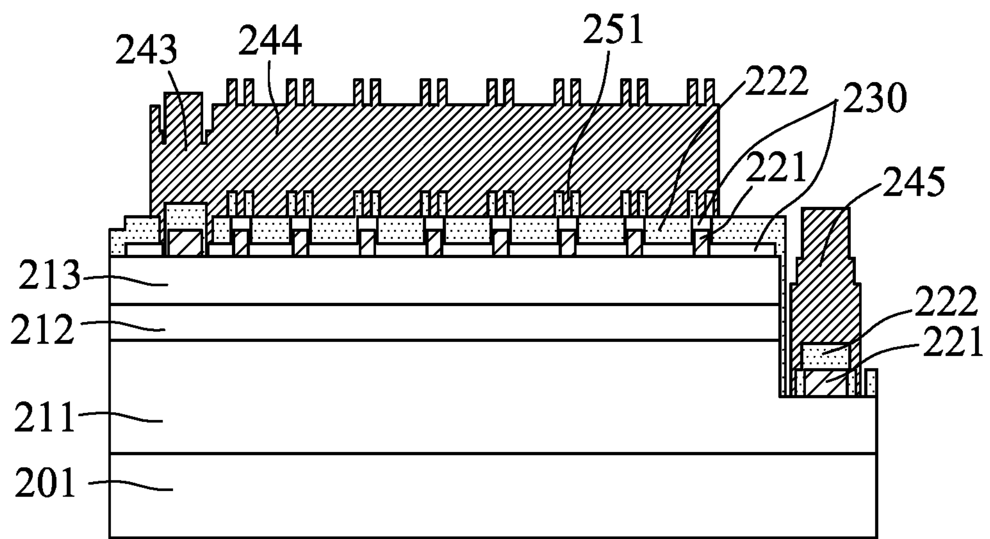
FIG. 15 is a schematic side view taken along line A-A of FIG. 14.
Figure 16:
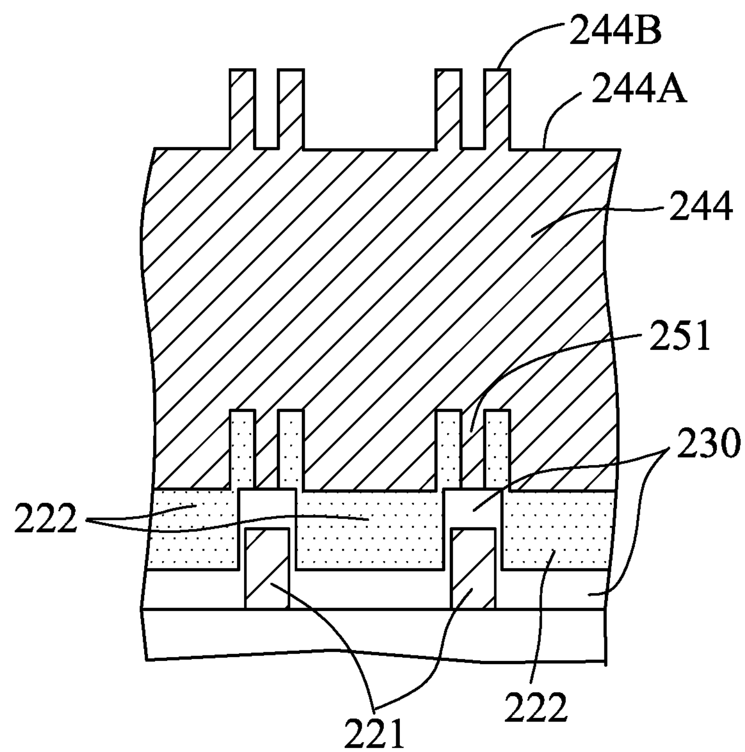
FIG. 16 is a partially enlarged schematic view of FIG. 15.

Referring to FIGS. 14 to 16, a fourth embodiment of the light-emitting diode according to the disclosure is similar to the third embodiment except for the following differences.

In the fourth embodiment, each of the insulation blocks of the insulation layer 221 is disposed below a corresponding one of the first holes 251 of the protective layer 222, and has a cross-sectional area larger than a size of a corresponding one of the first holes 251 of the protective layer 222.

Referring specifically to FIG. 16, the lower surface of the extension portion 244 of the first electrode 241 is formed with a plurality of recesses for the protective layer 222 to extend therein. Therefore, the adhesion between the extension portion 244 of the first electrode 241 and the protective layer 222 is enhanced so as to prevent the extension portion 244 of the first electrode 241 from stripping. In addition, the extension portion 244 of the first electrode is formed with an undulating top surface which has lower surfaces 244A and higher surfaces 244B. A total surface area of the higher surfaces 244B is significantly smaller than that of the lower surfaces 244A. Therefore, the contact area between the first electrode 241 and other objects may be reduced significantly, such that the damage to the extension portion 244 of the first electrode 241 during the subsequent procedures, such as inversion, transportation, and transfer may be reduced effectively, and the dirt of the extension portion 244 of the first electrode 241 may be decreased as well.

Figure 17:
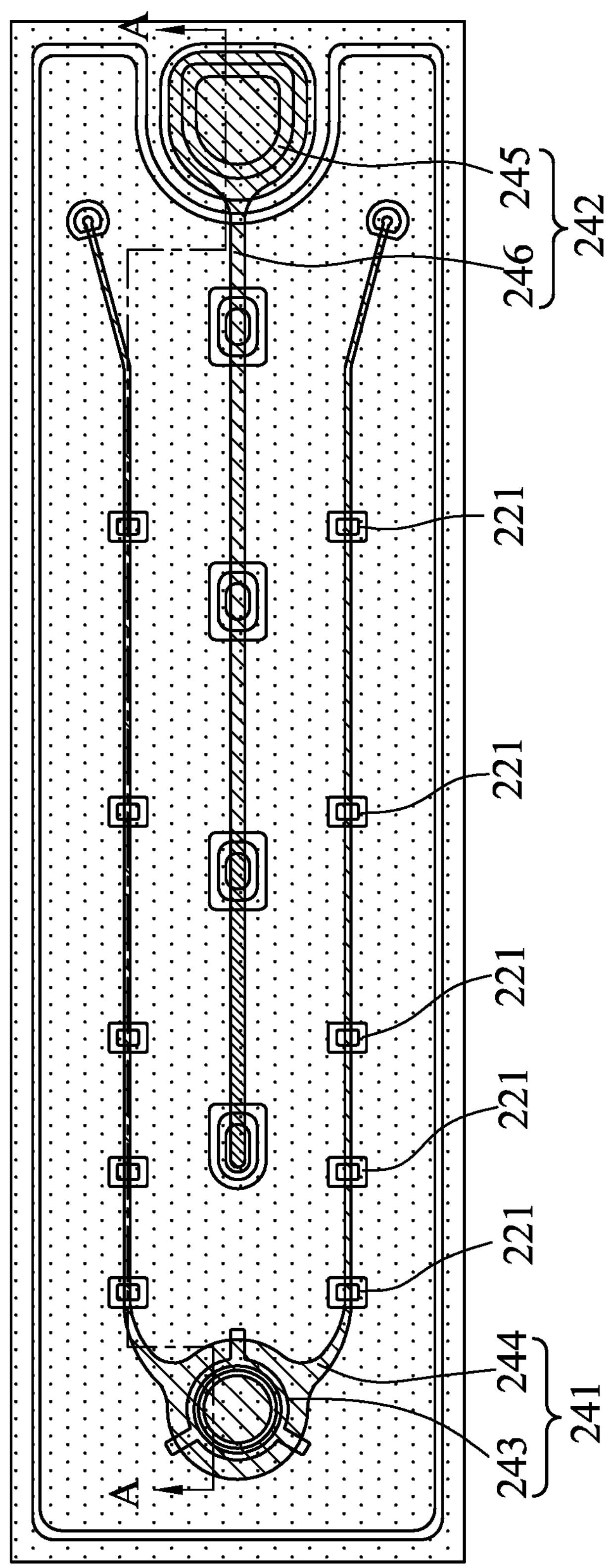
FIG. 17 is a schematic top view of a fifth embodiment of the light-emitting diode according to the disclosure.
Figure 18:
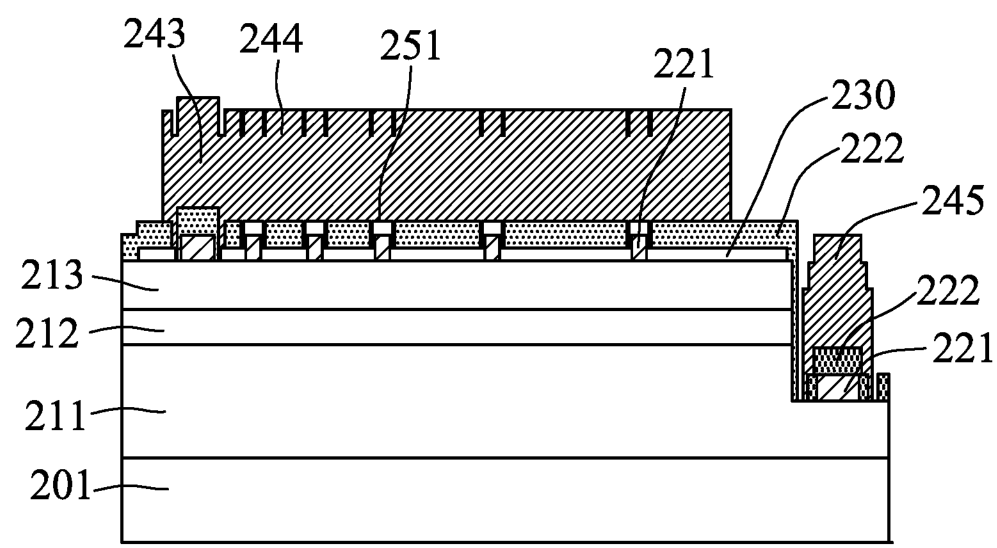
FIG. 18 is a schematic side view taken along line A-A of FIG. 17.

Referring to FIGS. 17 and 18, a fifth embodiment of the light-emitting diode according to the disclosure is similar to the third embodiment except for the following differences.

In the fifth embodiment, proximate ones of the insulation blocks relative to the pad area of the first electrode region are arranged more densely than distal ones of the insulation blocks relative to the pad area of the first electrode region, such that a superior current spreading may be obtained.

Figure 19:
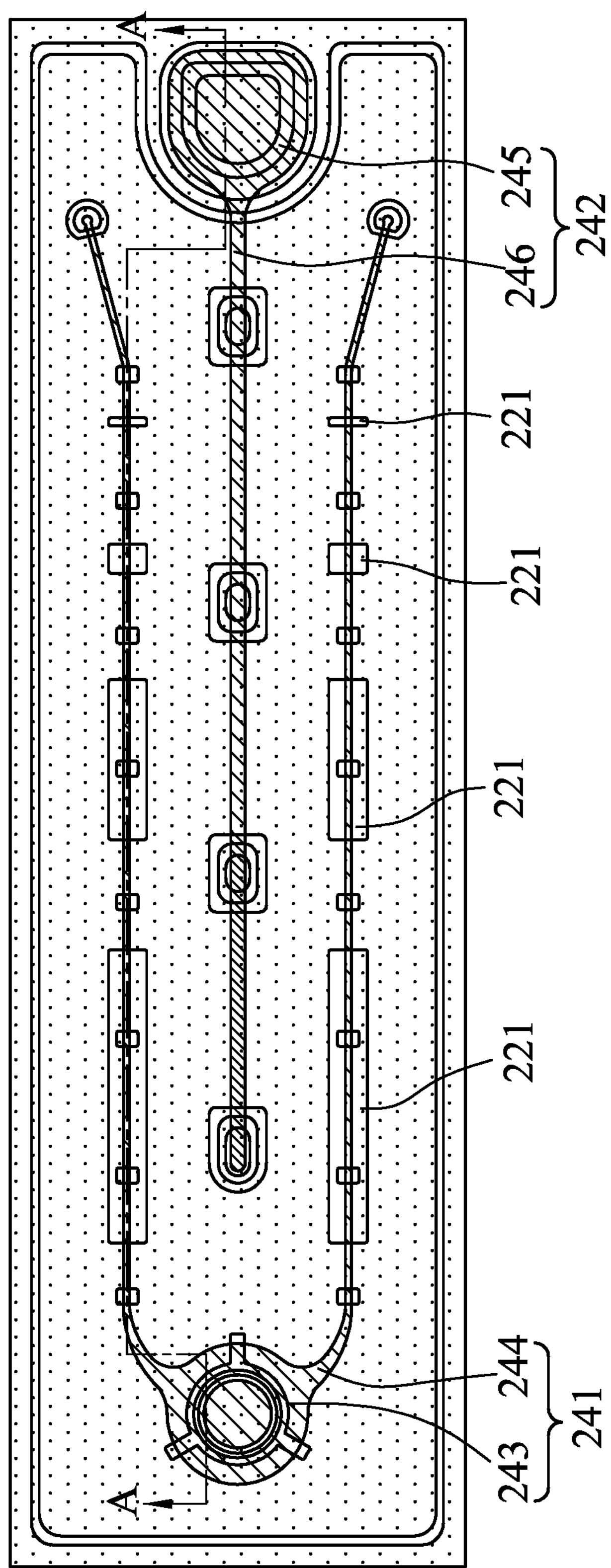
FIG. 19 is a schematic top view of a sixth embodiment of the light-emitting diode according to the disclosure.

Referring to FIGS. 19, a sixth embodiment of the light-emitting diode according to the disclosure is similar to the third embodiment except for the following differences.

In the sixth embodiment, a proximate one of the insulation blocks relative to the pad area of the first electrode region have a cross-sectional area larger than that of a distal one of the insulation blocks relative to the pad area of the first electrode region, such that a superior current spreading may be obtained.

Figure 20:
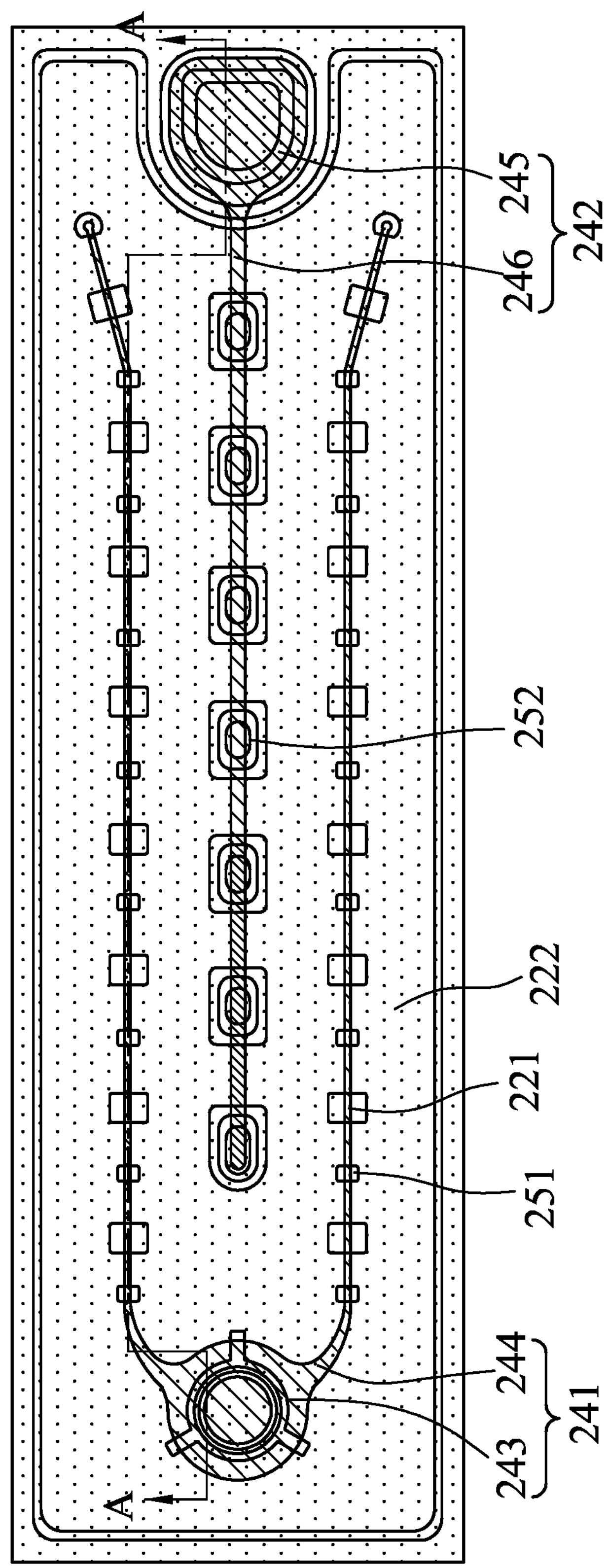
FIG. 20 is a schematic top view of a seventh embodiment of the light-emitting diode according to the disclosure.
Figure 21:
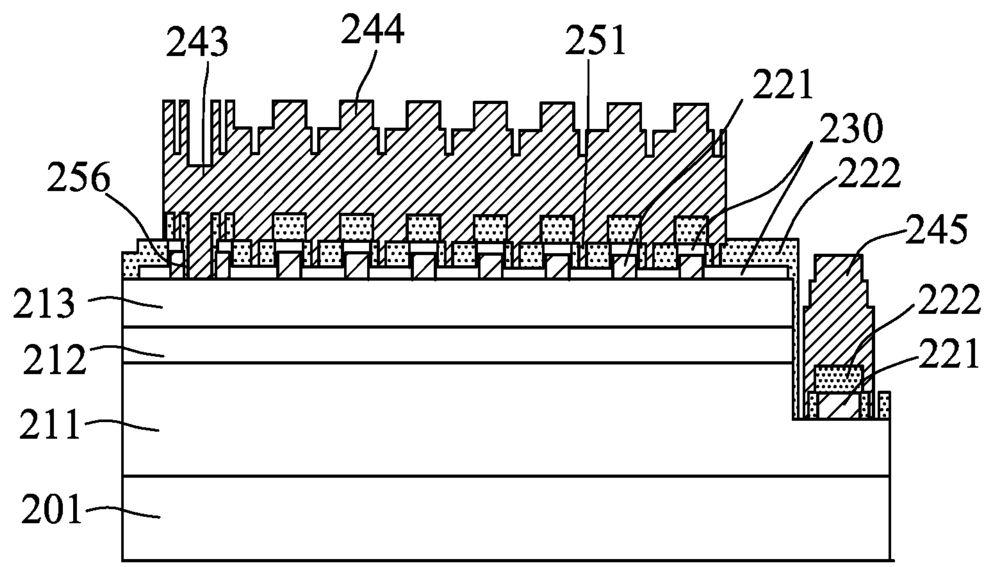
FIG. 21 is a schematic side view taken along line A-A of FIG. 20.
Figure 22:
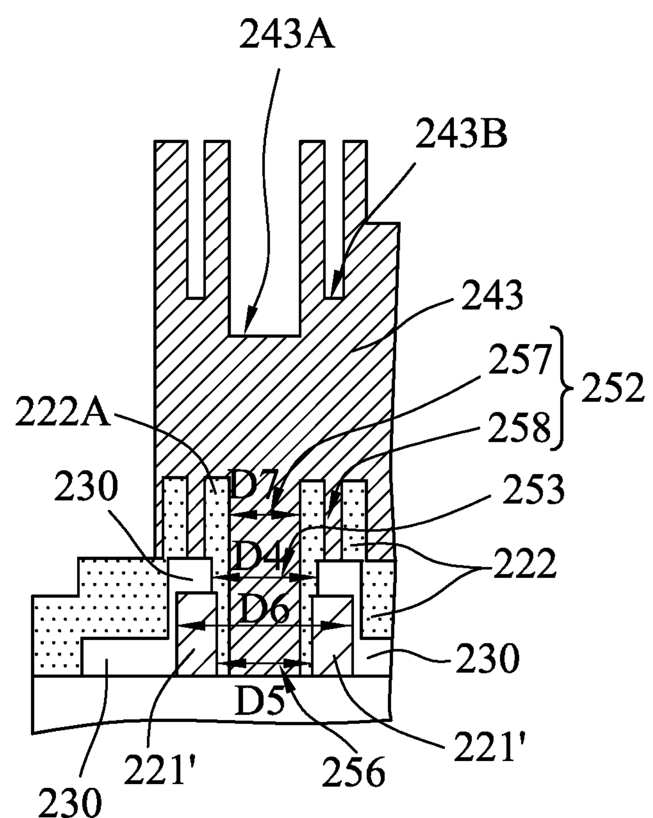
FIG. 22 is a partially enlarged schematic view of FIG. 21.

Referring to FIGS. 20 to 22, a seventh embodiment of the light-emitting diode according to the disclosure is similar to the first embodiment except for the following differences.

In the seventh embodiment, the insulation layer 221 includes an annular insulation portion 221', which is disposed below the pad portion 243 of the first electrode 241, and which has an hole 256. The hole 256 of the annular insulation portion 221' of the insulation layer 221 is in a position corresponding to that of the third hole 253 of the transparent conductive layer 230, and has a size not larger than that of the third hole 253. The second hole 252 of the protective layer 222 includes a central hole portion 257, and a surrounding hole portion 258 which surrounds the central hole portion 257 and which is spaced apart from the central hole portion 257 by a surrounding wall 222A. The surrounding hole portion 258 permits the transparent conductive layer 230 to be exposed, such that the pad portion 243 of the first electrode 241 is in contact with the transparent conductive layer 230. The central hole portion 257 permits the p-type layer 213 to be exposed, such that the pad portion 243 of the first electrode 241 is in contact with the p-type layer 213.

Referring specifically to FIG. 22, the third hole 253 of the transparent conductive layer 230 has a diameter (D4), the hole 256 of the annular insulation portion 221' has a diameter (D5), the annular insulation portion 221' has an outer diameter (D6), and the central hole portion 257 of the second hole 252 of the protective layer 222 has a diameter (D7). The diameters (D4, D5, D6, D7) have a relationship of D6>D4>D5>D7, such that a central part of the pad portion 243 of the first electrode 241 is in contact with the p-type layer 213.

The pad portion 243 of the first electrode 241 has a recessed top surface which has two recesses. Specifically, the recessed top surface of the pad portion 243 of the first electrode 241 has a central recess 243A and a surrounding recess 243B surrounding the central recess 243A. The central recess 243A is deeper than the surrounding recess 243B, which is beneficial for subsequent wire bonding.

Figure 23:
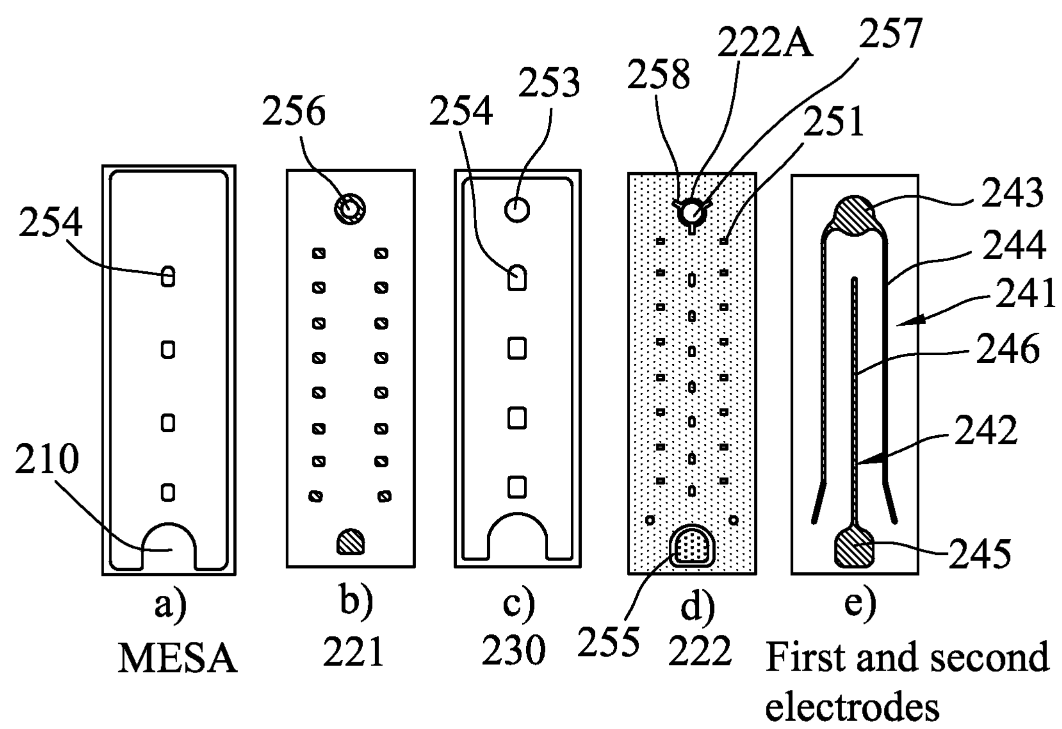
FIG. 23 is a schematic view illustrating photomasks for manufacturing the seventh embodiment shown in FIG. 20.

Referring to FIG. 23, a method for manufacturing the seventh embodiment is similar to that for manufacturing the first embodiment except for the following differences.

In the method for manufacturing the seventh embodiment, a photomask for forming the insulation layer 221 (i.e., step b)) has an annular opening for forming the hole 256 of the annular insulation portion 221'. A photomask for forming the protective layer 222 (i.e., step d)) has an opening for forming the central hole portion 257 of the second hole 252 of the protective layer 222.

In a variation of the seventh embodiment, the central hole portion 257 and the surrounding hole portion 258 of the second hole 252 of the protective layer 222 are not spaced apart from each other by the surrounding wall 222A so as to merge together to form a single hole, such that the pad portion 243 of the first electrode 241 is in contact with the protective layer 222, the transparent conductive layer 230, the annular insulation portion 221', and the p-type layer 213. The recessed top surface of the pad portion 243 of the first electrode 241 may have more than two recesses.

Figure 24:
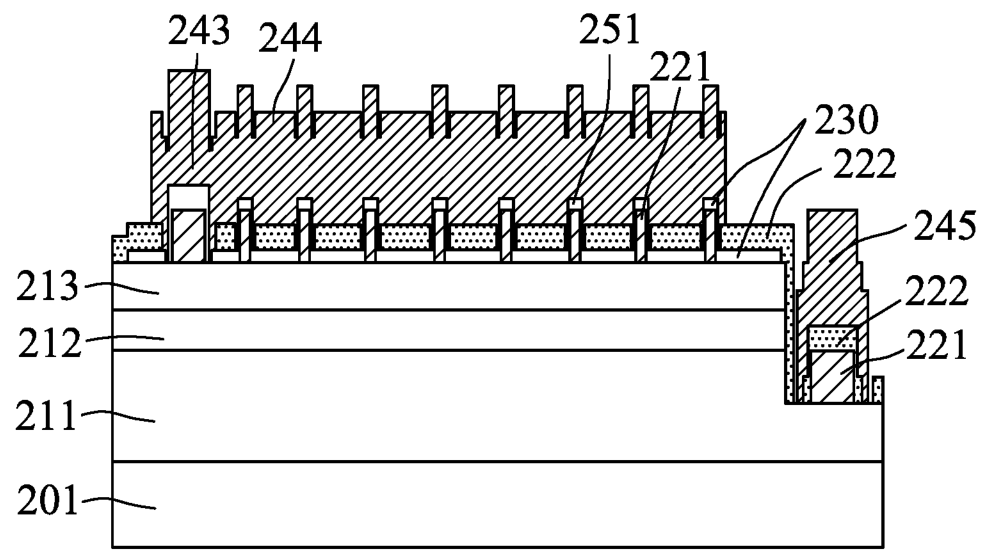
FIG. 24 is a schematic side view of an eighth embodiment of the light-emitting diode according to the disclosure.
Figure 25:
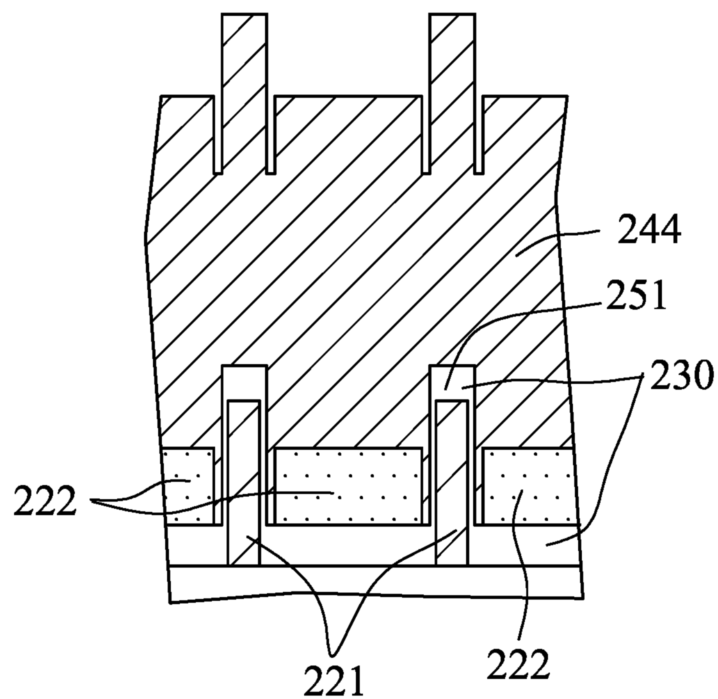
FIG. 25 is a partially enlarged schematic view of FIG. 24.

Referring to FIGS. 24 and 25, an eighth embodiment of the light-emitting diode according to the disclosure is similar to the third embodiment except for the following differences.

In the eighth embodiment, the insulation layer 221 has a thickness which is significantly greater than that of the protective layer 222 and even greater than a total thickness of the transparent conductive layer 230 and the protective layer 222.

In certain embodiments, the insulation layer 221 and the protective layer 222 are made of a same material, and the difference of thickness therebetween is determined by an equation of:

$$(2k)\Lambda/4n,$$

wherein k is a natural number of at least 1,

Λ is a wavelength of light emitted from the light-emitting layer 212, and n is a refractive index of the insulation layer 221.

In certain embodiments, the thickness of the insulation layer 221 ranges from 300 nm to 1000 nm, and the thickness of the protective layer 222 ranges from 100 nm to 250 nm.

Referring specifically to FIG. 25, when the thickness of the insulation layer 221 is increased, the surface area of the transparent conductive layer 230 may be increased, so that the contact area between the extension portion 244 of the first electrode 241 and the transparent conductive layer 230 may be increased, which is beneficial to current spreading. Therefore, the current congestion effect on the pad portion 243 and the extension portion 244 of the first electrode 241 may be alleviated, and the risks of metal precipitation and electrode burning may be reduced.

In addition, a groove structure may be formed between adjacent two of the insulation blocks of the insulation layer 221, so that the adhesive force provided to the extension part 244 of the first electrode 241 may be increased, and the risk of the first electrode 241 being stripped may be reduced.

Figure 26:
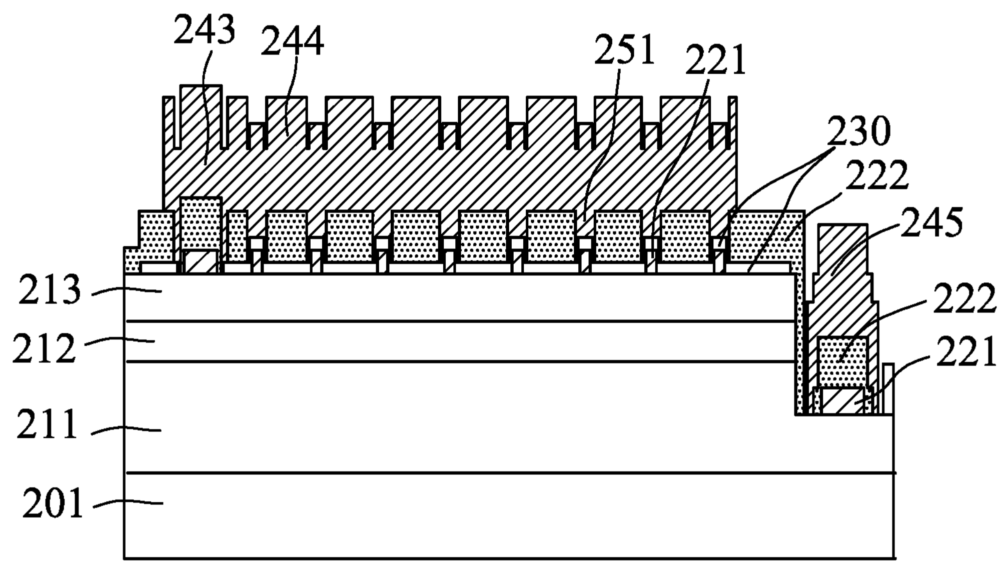
FIG. 26 is a schematic side view of a ninth embodiment of the light-emitting diode according to the disclosure.
Figure 27:
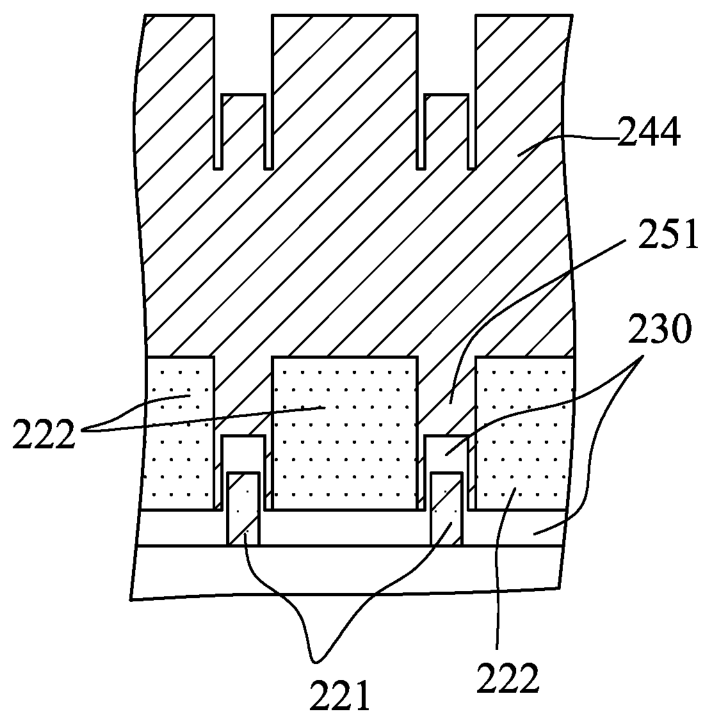
FIG. 27 is a partially enlarged schematic view of FIG. 26.

Referring to FIGS. 26 and 27, a ninth embodiment of the light-emitting diode according to the disclosure is similar to the eighth embodiment except for the following differences.

In the ninth embodiment, the thickness of the protective layer 222 is significantly greater than that of the insulation layer 221.

In certain embodiments, the insulation layer 221 and the protective layer 222 are made of a same material, and the difference of thickness therebetween is determined by an equation of:

$$(2k)\Lambda/4n,$$

wherein k is a natural number of at least 1,

Λ is a wavelength of light emitted from the light-emitting layer 212, and n is a refractive index of the protective layer 222.

In certain embodiments, the thickness of the insulation layer 221 ranges from 50 nm to 300 nm, and the thickness of the protective layer 222 ranges from 200 nm to 2000 nm.

Referring specifically to FIG. 27, since the thickness of the insulation layer 221 is significantly less than that of the protective layer 222, the insulation blocks of the insulation layer 221 are in positions corresponding to those of the first holes 251 of the protective layer 222, respectively, below the extension portion 244 of the first electrode 241, such that the protective layer 222 is formed with a plurality of recesses which are in positions corresponding to those of the insulation blocks of the insulation layer 221. Therefore, the extension portion 244 of the first electrode 241 may fill the recesses, such that the adhesive force provided to the extension part 244 of the first electrode 241 is increased and the risk of the first electrode 241 being stripped is reduced.

Figure 28:
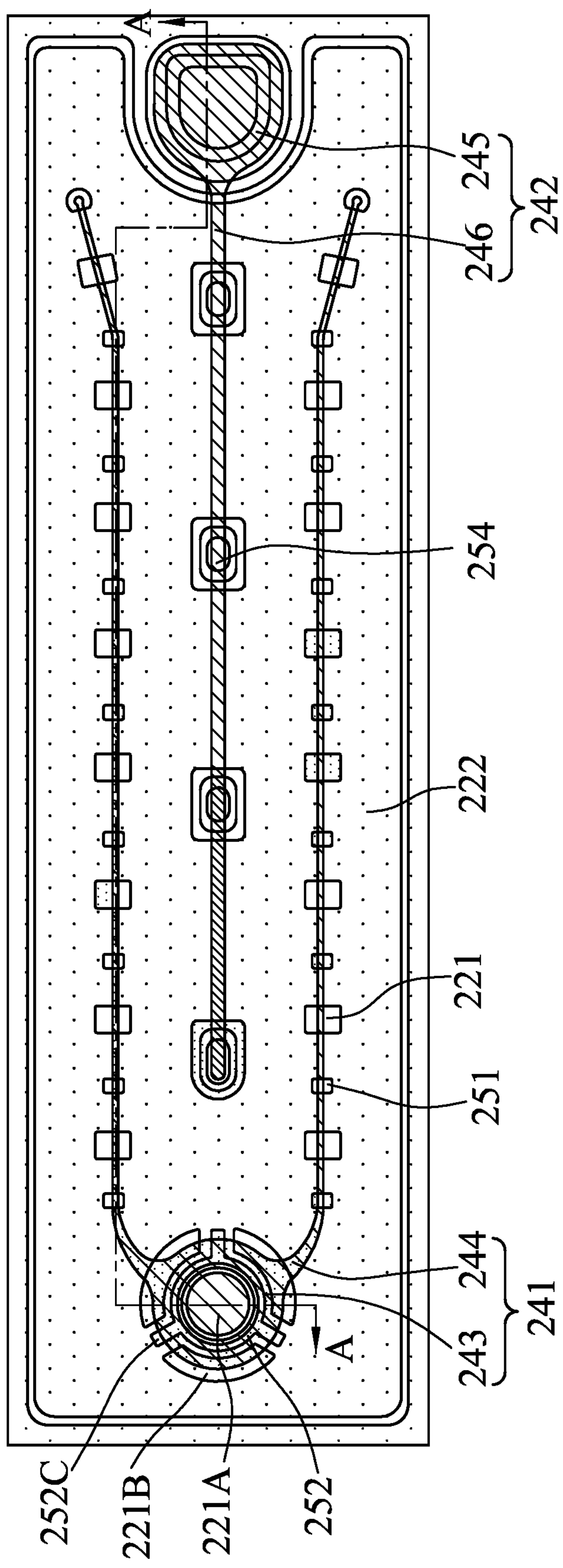
FIG. 28 is a schematic top view of a tenth embodiment of the light-emitting diode according to the disclosure.
Figure 29:
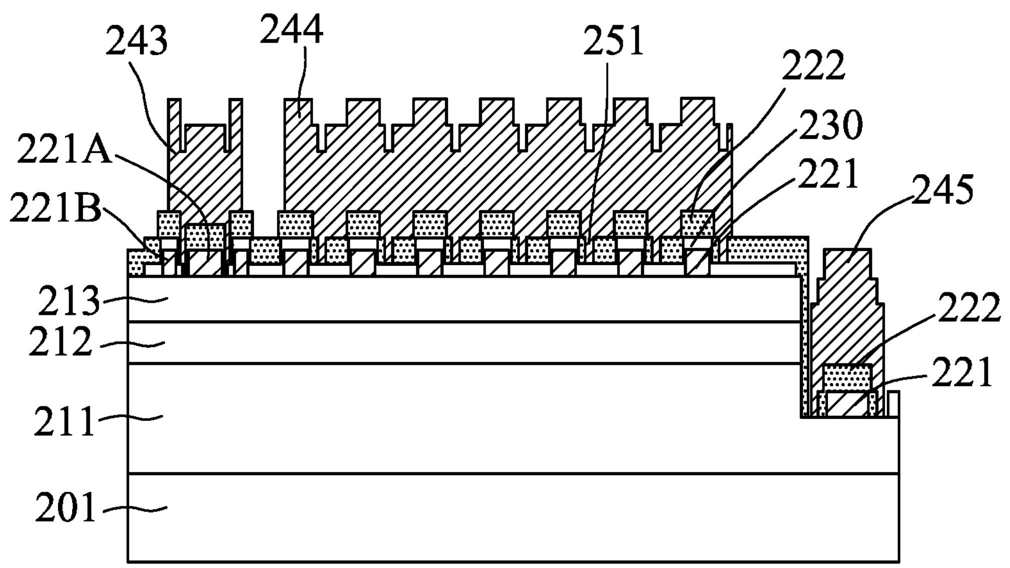
FIG. 29 is a schematic side view taken along line A-A of FIG. 28.

Referring to FIGS. 28 and 29, a tenth embodiment of the light-emitting diode according to the disclosure is similar to the first embodiment except for the following differences.

In the tenth embodiment, in addition to the insulation portion 221A, the insulation layer 221 at the pad area of the first electrode region further includes a plurality of insulation blocks 221B which are arranged to surround a center of the pad area of the first electrode region and which are angularly spaced apart from one another. Specifically, the insulation blocks 221B surround the insulation portion 221A, and cooperatively define an outer diameter which may be greater than, equal to, or less than a diameter of the pad portion 243 of the first electrode 241. The second hole 252 includes a plurality of the hole-protruding portions which are staggered from the insulation blocks 221B disposed at the pad area of the first electrode region.

Figure 30:
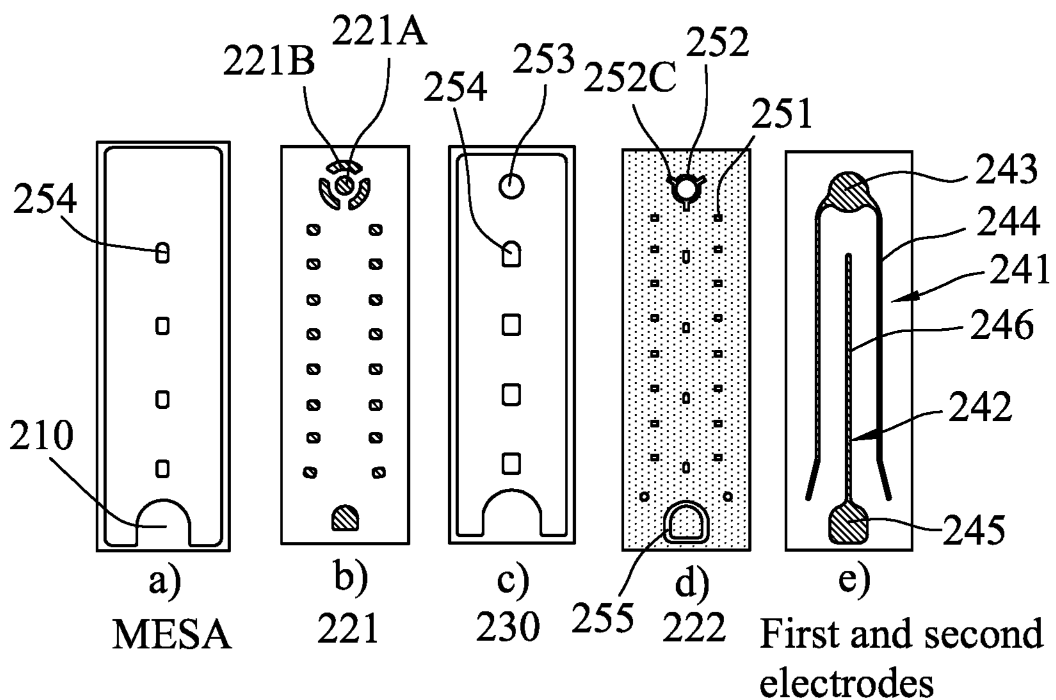
FIG. 30 is a schematic view illustrating photomasks for manufacturing the tenth embodiment shown in FIG. 28.

Referring to FIG. 30, a method for manufacturing the tenth embodiment is similar to that for manufacturing the first embodiment except for the following differences.

In the method for manufacturing the tenth embodiment, a photomask for forming the insulation layer 221 (i.e., step b)) further has a plurality of surrounding holes for forming the insulation blocks 221B.

The insulation blocks 221B may increase the undulation of the top surface of the pad portion 243 of the first electrode 241, such that the reliability of the bonding wire may be enhanced and the solder ball will not be easily stripped or pushed off under an external force.

Figure 31:
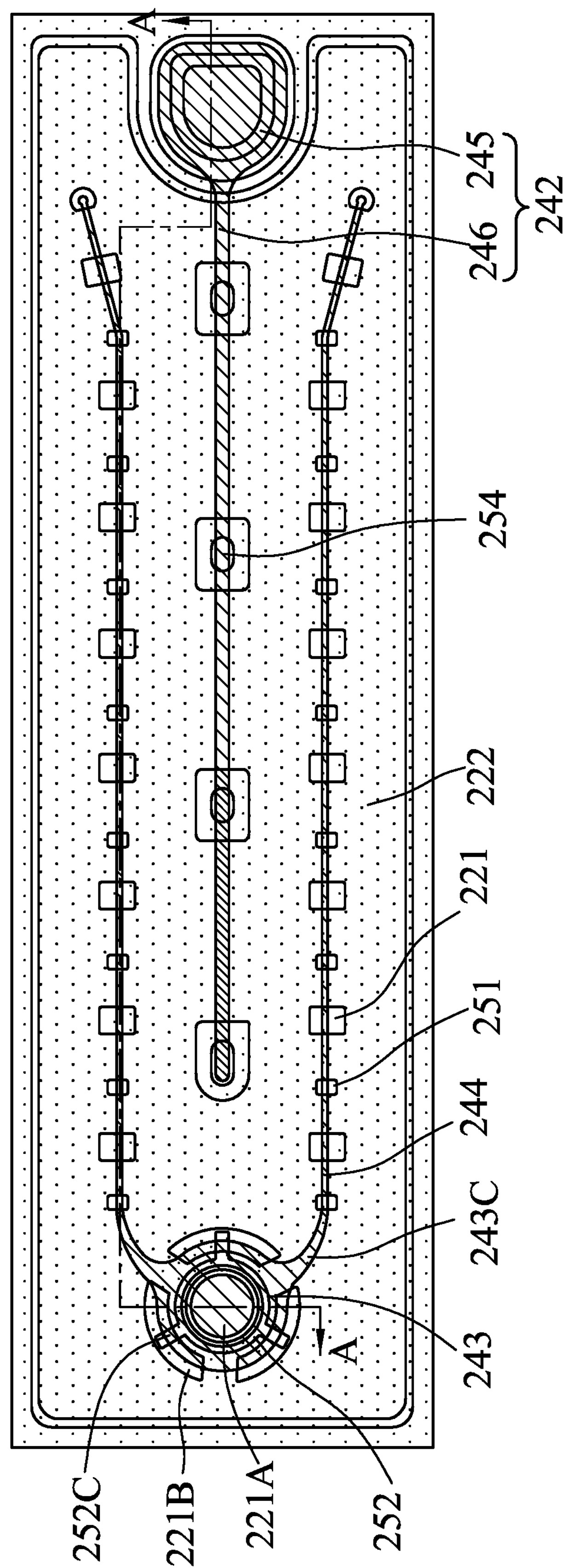
FIG. 31 is a schematic top view of an eleventh embodiment of the light-emitting diode according to the disclosure.

Referring to FIG. 31, an eleventh embodiment of the light-emitting diode according to the disclosure is similar to the tenth embodiment except for the following differences.

In the eleventh embodiment, two adjacent ones of the insulation blocks 221B at the pad area of the first electrode region define therebetween a clearance, and the first electrode 241 further includes an interconnecting portion 243C which interconnects the pad portion 243 and the extension portion 244 and which is disposed above a corresponding one of the clearances, such that the pad portion 243 of the first electrode 241 is in a position higher than that of the interconnecting portion 243C. Therefore, the interconnecting portion 243C may be not easily damaged by solder balls used in subsequent wire bonding, and the stability of a chip may be improved.

The protective layer 222 further has the second hole 252 disposed above the p-type layer 213 at the pad area of the first electrode region. The second hole 252 includes a plurality of the hole-protruding portions 252*c* that protrudes radially and outwardly and are angularly spaced apart from one another. The hole-protruding portions 252*c* are respectively aligned with the insulation blocks 221B at the pad area of the first electrode region.

Figure 32:
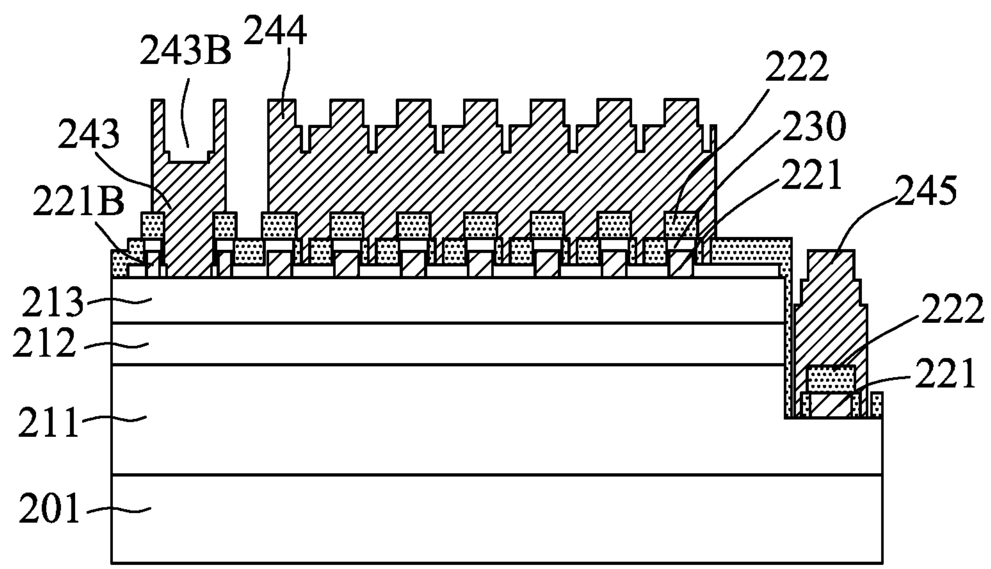
FIG. 32 is a schematic side view of a twelfth embodiment of the light-emitting diode according to the disclosure.
Figure 33:
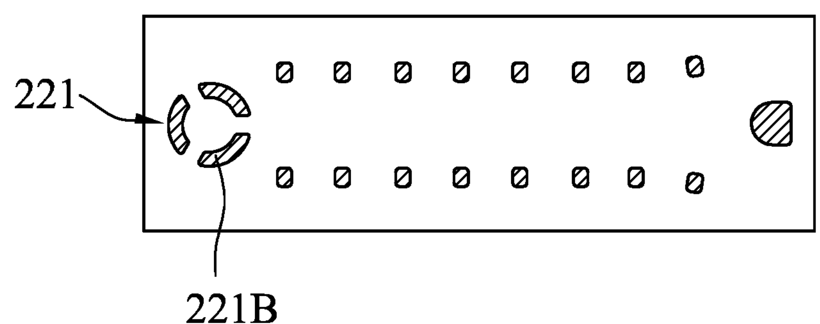
FIG. 33 is a schematic view illustrating a photomask for manufacturing an insulation layer in the twelfth embodiment shown in FIG. 32.

Referring to FIGS. 32 and 33, a twelfth embodiment of the light-emitting diode according to the disclosure is similar to the tenth embodiment except for the following differences.

In the twelfth embodiment, the insulation layer 221 at the pad area of the first electrode region is composed of a plurality of the insulation blocks 221B (i.e. without the insulation portion 221A), such that the central part of the pad portion 243 of the first electrode 241 is in direct contact with the p-type layer 213.

Since the central part of the pad portion 243 of the first electrode 241 is in direct contact with the p-type layer 213, the adhesion between the pad portion 243 of the first electrode 241 and the light-emitting epitaxial layered unit is increased. In addition, the pad portion 243 of the first electrode 241 is formed with a stepped top surface 243B, which is beneficial for subsequent wire bonding.

Figure 34:
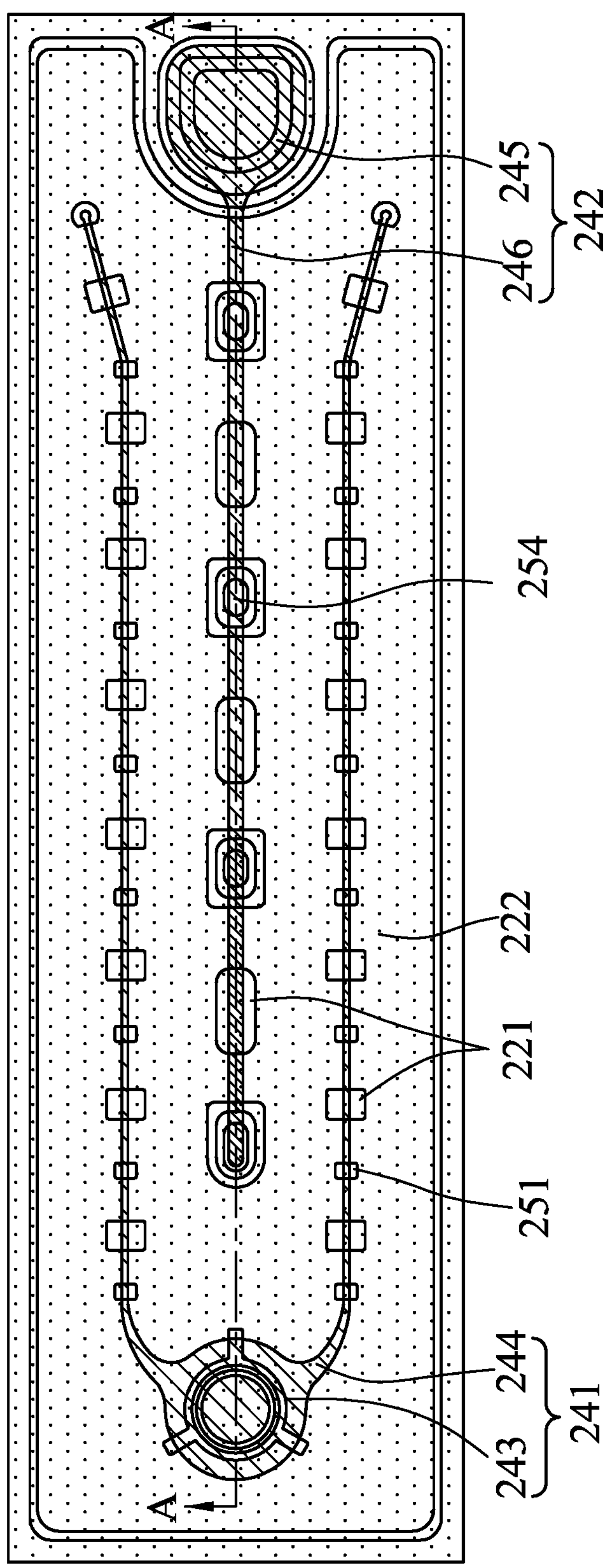
FIG. 34 is a schematic top view of a thirteenth embodiment of the light-emitting diode according to the disclosure.
Figure 35:
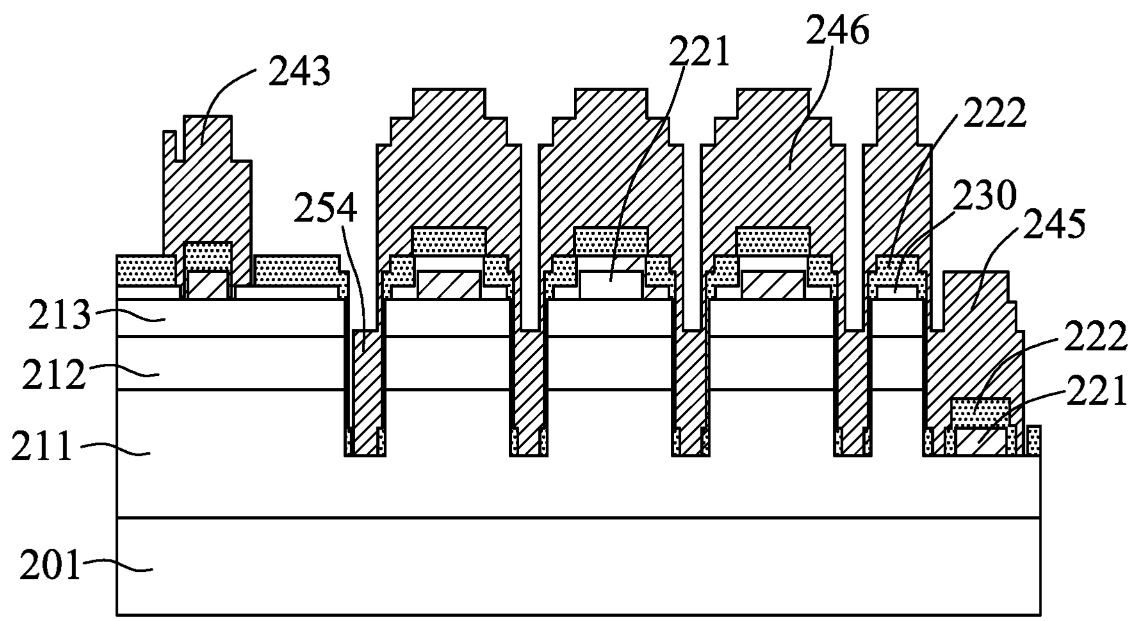
FIG. 35 is a schematic side view taken along line A-A of FIG. 34.
Figure 36:
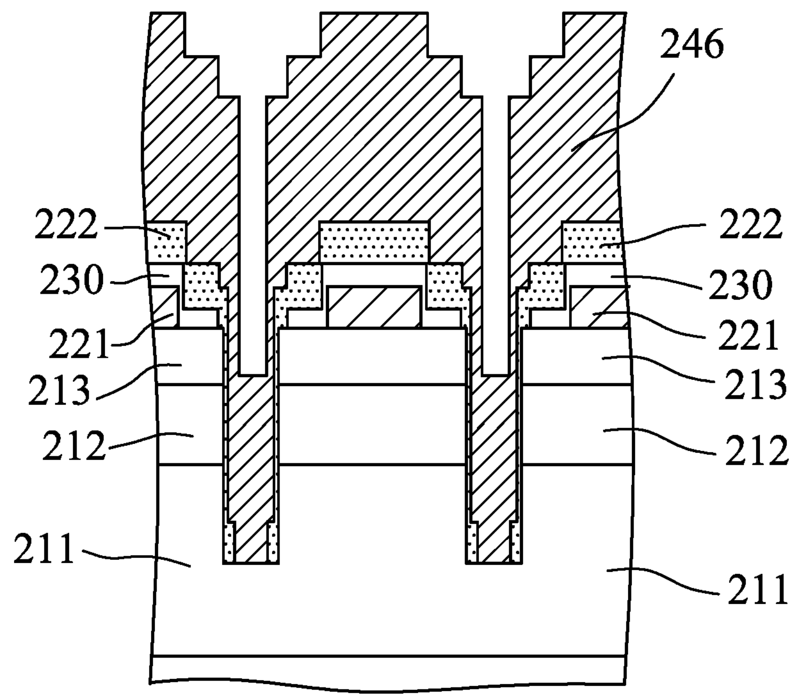
FIG. 36 is a partially enlarged schematic view of FIG. 35.

Referring FIGS. 34 to 36, a thirteenth embodiment of the light-emitting diode according to the disclosure is similar to the first embodiment except for the following differences.

In the thirteenth embodiment, the insulation layer 221 is further disposed on the extension area of the second electrode region, and the transparent conductive layer 230 covers the insulation layer 221 on the extension area of the second electrode region.

Referring specifically to FIG. 35, the insulation layer 221, the transparent conductive layer 230, and the protective layer 222 are laminated sequentially on the p-type layer 213, and are disposed between the extension portion 246 of the second electrode 242 and the p-type layer 213.

Referring specifically to FIG. 36, the extension portion 246 of the second electrode 242 is formed on the protective layer 222, and the transparent conductive layer 230, the insulation layer 221, and the P-type layer 213 are disposed under the protective layer 222 in such order. The extension portion 246 of the second electrode 242 is conductive to the n-type layer 211 through the vias 254. In addition, the protective layer 222 and the insulation layer 221 are disposed under the pad portion 245 of the second electrode 242.

The spacing distances or the sizes of the vias 254 may be changed to alleviate current crowding effect and to improve uniformity of current injection, so as to enhance the stability of the light-emitting diode.

In the embodiment, the insulation layer 221 and the protective layer 222 are formed below the second electrode 242. The insulation layer 221 and the protective layer 222 are made of materials having a low-refractive-index (preferably less than 1.5) to increase the thickness thereof, such that the total reflection effect is enhanced and the total reflectivity is increased.

Figure 37:
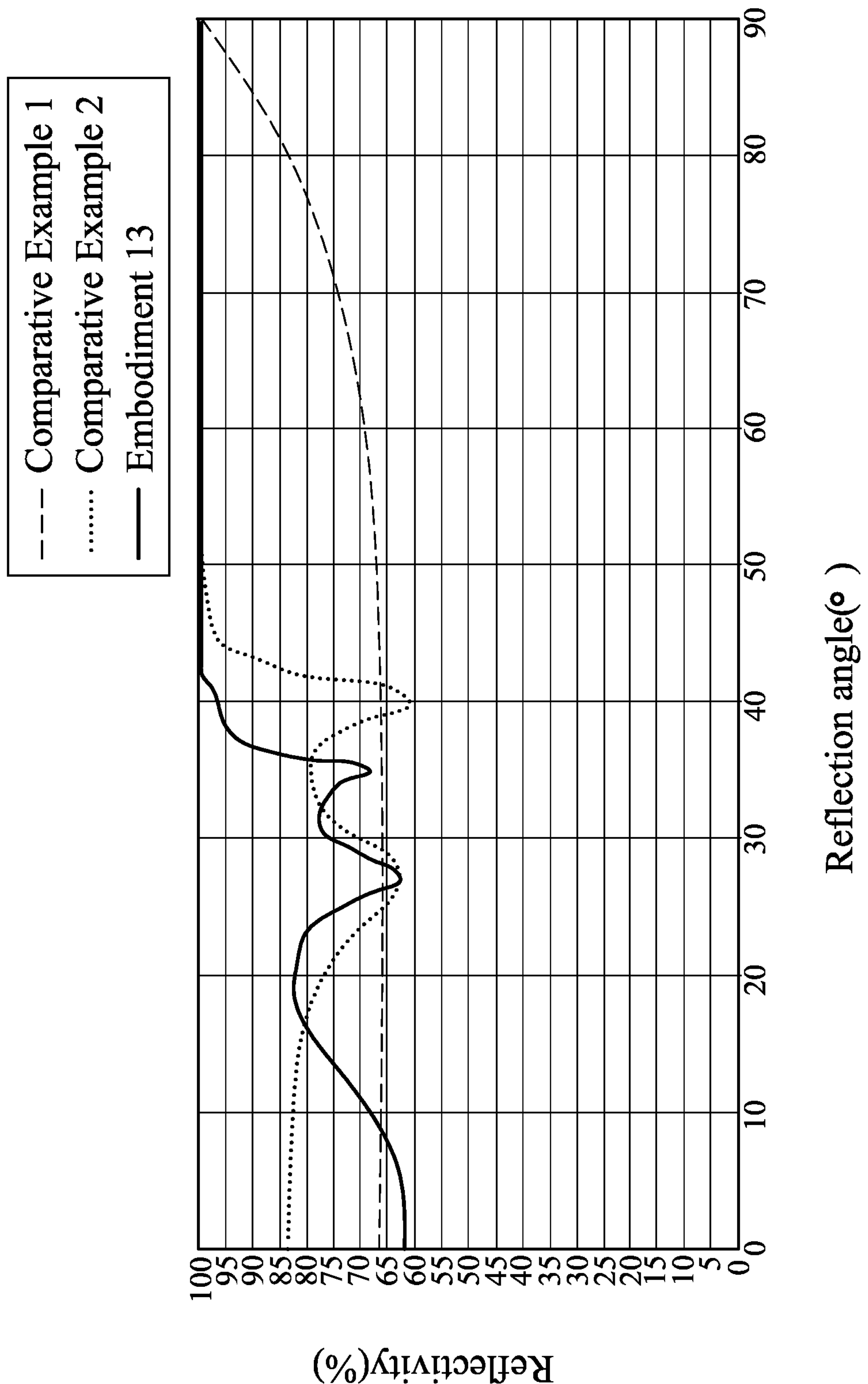
FIG. 37 is a diagram comparing the reflectivity of the light-emitting diode of the thirteenth embodiment shown in FIG. 34 and those of the conventional light-emitting diodes shown in FIGS. 1 and 2 (referred to as Comparative Examples 1 and 2, respectively in the figure).

Referring to FIG. 37, in the light-emitting diode of Comparative Example 1, an insulation layer and a protective layer are not disposed under a second electrode. In the light-emitting diode of Comparative Example 2, only a protective layer, which is made of $SiO_2$ and has a thickness of 230 nm, is disposed under a second electrode. In the light-emitting diode of Example 13, both the insulation layer 221 and the protective layer 222, which are made of $SiO_2$ and has a total thickness of 460 nm, are disposed under the second electrode 242. As shown by the graphs in FIG. 37, the overall reflectivity of the light-emitting diode of Example 13 is better than those of Comparative Examples 1 and 2.

In the light-emitting diode according to the disclosure, the protective layer is formed on the transparent conducting layer, followed by formation of the first and second electrodes. Therefore, on one hand, the protective layer may protect the light-emitting diode from being damaged, and on the other hand, the protective layer and the insulation layer may be used together as a complex current blocking layer for inhibiting over-injection of current below the first and/or second electrodes and for increasing current spreading of the transparent conductive layer.

The first electrode is in direct contact with the first semiconductor layer at the pad area of the first electrode region, so that the adhesion between the first electrode and the light-emitting epitaxial layered unit may be enhanced effectively, and the risk of the first electrode being stripped during wire bonding may be reduced.

The insulation layer and the protective layer are designed to reduce the metal light-blocking area of the first and/or second electrode and the expansion area thereof by utilizing the refraction effect, and thus improves the light extraction efficiency of the light-emitting diode.

The insulation layer, the transparent conductive layer, the protective layer, and the first and/or second electrode are designed to act as an omni-directional reflector, so that the reflecting capability of the first and/or second electrode can be improved, and the light absorption effect can be reduced.

The protective layer is formed on the transparent conducting layer, followed by formation of the first and second electrodes, so that the probability of the active metal in the first and second electrodes being oxidized during formation of the protective layer may be reduced.

The insulation layer below the extension portion of the first electrode may inhibit the over-injection of the current below the extension portion of the first electrode, and increase the length and uniformity of the current injection.

The insulation layer and the protective layer are disposed below the extension portion of the first electrode, so that the extension portion of the first electrode is formed with an undulating top surface. Therefore, the damage to the extension portion of the first electrode, which may occur during subsequent procedures, such as inversion, transportation, transfer, and the like, may be reduced.

The insulation layer is disposed below the extension portion of the second electrode, so that the transverse spreading and the uniformity of the current may be increased.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting diode, comprising:

a light-emitting epitaxial layered unit which includes a first semiconductor layer, a second semiconductor layer, and a light-emitting layer sandwiched between said first semiconductor layer and said second semiconductor layer;

a transparent conductive layer disposed on said first semiconductor layer;

an insulation layer disposed between said first semiconductor and said transparent conductive layer;

a protective layer disposed on said transparent conductive layer and having a plurality of first holes to permit said transparent conductive layer to be exposed;

a first electrode which is disposed on said protective layer, and which includes an extension portion filling said first holes so as to electrically connect said transparent conductive layer, a part of said first electrode being in direct contact with a portion of said first semiconductor layer; and a second electrode electrically connected to said second semiconductor layer and spaced apart from said first electrode, wherein said insulation layer, said transparent conductive layer, and said protective layer are laminated sequentially on said first semiconductor layer.

2. The light-emitting diode according to claim 1, wherein said insulation layer is disposed at an area under said extension portion of said first electrode.

3. The light-emitting diode according to claim 1, wherein said insulation layer includes a plurality of insulation blocks spaced apart from one another.

4. The light-emitting diode according to claim 3, wherein said insulation blocks of said insulation layer are in positions corresponding to those of said first holes of said protective layer, respectively.

5. The light-emitting diode according to claim 1, wherein said light-emitting epitaxial layered unit has a top surface including a first electrode region that includes a pad area, said first electrode further includes a pad portion, and said protective layer further has a second hole disposed above said first semiconductor layer at said pad area of said first electrode region and under said pad portion of said first electrode.

6. The light-emitting diode according to claim 5, wherein said transparent conductive layer has a third hole disposed above said pad portion of said first electrode, and said first electrode fills said second hole of said protective layer and said third hole of said transparent conductive layer so as to permit said first electrode to be in direct contact with a portion of said first semiconductor layer at said pad area of said first electrode region.

7. The light-emitting diode according to claim 5, wherein said second hole includes at least one hole-protruding portion that protrudes radially and outwardly.

8. The light-emitting diode according to claim 5, wherein said top surface of said light-emitting epitaxial layered unit further includes a second electrode region on which said second electrode is disposed, said second electrode region including a mesa portion at which said second semiconductor layer is exposed, said protective layer covering said mesa portion and further having a fourth hole to permit a part of said second semiconductor layer to expose.

9. The light-emitting diode according to claim 5, wherein said top surface of said light-emitting epitaxial layered unit further includes a second electrode region configured as a mesa-shaped surface on which said second electrode is disposed, said second electrode including an extension portion which is disposed on said protective layer and which extends downwardly to penetrate through said first semiconductor layer and said light-emitting layer to form an ohmic contact with said second semiconductor layer.

10. A light-emitting diode, comprising:

a light-emitting epitaxial layered unit which includes a first semiconductor layer, a second semiconductor layer, and a light-emitting layer sandwiched between said first semiconductor layer and said second semiconductor layer, said light-emitting epitaxial layered unit having a plurality of vias, each of which extends through said first semiconductor layer and said light-emitting layer to terminate at a bottom surface in said second semiconductor layer so as to permit said second semiconductor layer to be exposed;

a transparent conductive layer disposed on said first semiconductor layer and having a plurality of holes which are in positions corresponding to those of said vias, respectively;

a protective layer disposed on said transparent conductive layer and extending downwardly along an inner peripheral surface of each of said vias to terminate at said bottom surface of each of said vias to permit said second semiconductor layer to be exposed, said light-emitting epitaxial layered unit having a top surface including a first electrode region and a second electrode region, each of which includes a pad area and an extension area;

an insulation layer disposed on said pad area and said extension area of said first electrode region;

a first electrode disposed on said protective layer and electrically connected to said transparent conductive layer, a part of said first electrode being in direct contact with a portion of said first semiconductor layer; and a second electrode disposed on said protective layer and including an extension portion filling said vias so as to electrically connect said second semiconductor layer;

wherein said insulation layer, said transparent conductive layer, and said protective layer are laminated sequentially on said first semiconductor layer.

11. The light-emitting diode according to claim 10, wherein said first electrode and said second electrode are disposed at said first electrode region and said second electrode region, respectively.

12. The light-emitting diode according to claim 10, wherein said insulation layer is further disposed on said extension area of said second electrode region, and said transparent conductive layer covers said insulation layer on said extension area of said second electrode region.

13. The light-emitting diode according to claim 10, wherein said first electrode includes a pad portion and an extension portion, and said insulation layer, said transparent conductive layer, and said protective layer are disposed between said extension portion of said first electrode and said first semiconductor layer.

14. The light-emitting diode according to claim 10, wherein said first electrode includes a pad portion and an extension portion, said pad portion of said first electrode being in direct contact with said first semiconductor layer.

15. The light-emitting diode according to claim 10, wherein said first electrode includes a pad portion and an extension portion, said pad portion of said first electrode having a stepped top surface.

16. The light-emitting diode according to claim 10, wherein said first electrode includes a pad portion and an extension portion, said extension portion of said first electrode having a stepped top surface.

17. The light-emitting diode according to claim 10, wherein said second electrode includes a pad portion and an extension portion, and said protective layer is disposed between said pad portion of said second electrode and said insulation layer.

* * * * *